United States Patent
Kojima et al.

(10) Patent No.: US 6,741,518 B2
(45) Date of Patent: May 25, 2004

(54) SEMICONDUCTOR INTEGRATED CIRCUIT DEVICE AND DATA WRITING METHOD THEREFOR

(75) Inventors: Kazumi Kojima, Kasugai (JP); Yasushige Ogawa, Kasugai (JP); Hiroyuki Sugamoto, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 122 days.

(21) Appl. No.: 10/005,345

(22) Filed: Dec. 7, 2001

(65) Prior Publication Data

US 2002/0191476 A1 Dec. 19, 2002

(30) Foreign Application Priority Data

Jun. 15, 2001 (JP) ......................... 2001-180923

(51) Int. Cl.[7] ................................. G11C 8/00
(52) U.S. Cl. ..................... 365/230.06; 365/189.02; 365/226
(58) Field of Search ............ 365/230.06, 189.02, 365/226

(56) References Cited

U.S. PATENT DOCUMENTS

| | | | |
|---|---|---|---|
| 5,010,523 A | 4/1991 | Yamauchi | 365/205 |
| 6,016,279 A | 1/2000 | Chi | 365/203 |
| 6,098,145 A | 8/2000 | Huang | 711/1 |
| 6,181,620 B1 | 1/2001 | Agata et al. | 365/203 |
| 6,373,783 B1 * | 4/2002 | Tomita | 365/233 |
| 6,452,859 B1 * | 9/2002 | Shimano et al. | 365/230.06 |
| 6,483,765 B2 * | 11/2002 | Han | 365/230.03 |

FOREIGN PATENT DOCUMENTS

EP 0 393 347 A2 10/1990

* cited by examiner

*Primary Examiner*—Richard Elms
*Assistant Examiner*—Pho M. Luu
(74) *Attorney, Agent, or Firm*—Arent Fox Kintner Plotkin & Kahn

(57) ABSTRACT

Provided is a semiconductor integrated circuit device capable of, when data is written into a memory cell, fixing adjacent complimentary bit lines to a predetermined voltage, thereby reducing an effect of a write noise for a readout operation of the adjacent cells, making it possible to ensure stable operation. An address signal is inputted to a bit line short signal circuit and a column switch signal circuit, and the corresponding bit line short signal BRS0 or BRS1 and column switch signal CL01 or CL11 are selected. Complimentary bit lines /BL1, /BL2 or bit lines BL1 and BL2 in which a memory cell is not connected according to the bit line short signals BRS0 and BRS1 are selected altogether, these bit lines are fixed to a precharge voltage VPR, and a write noise is shielded. The column switch signal CL01 or CL11 makes conductive the corresponding column switches, and the selected bit line BL1, BL2, /BL1, or /BL2 is connected to a data bus DB or /DB.

20 Claims, 23 Drawing Sheets

MEMORY CELL SECTION IN A SPECIFIC EXAMPLE ACCORDING TO FIRST EMBODIMENT

FIG. 1  DIAGRAM ILLUSTRATING A PRINCIPLE ACCORDING TO FIRST EMBODIMENT

FIG. 2  MEMORY CELL SECTION IN A SPECIFIC EXAMPLE ACCORDING TO FIRST EMBODIMENT

FIG. 3 TIME CHART SHOWING A WRITE OPERATION IN A SPECIFIC EXAMPLE OF FIRST EMBODIMENT

BIT LINE SHORT CIRCUIT IN A SPECIFIC EXAMPLE OF FIRST EMBODIMENT

BIT LINE SHORT SIGNAL CIRCUIT IN A SPECIFIC EXAMPLE OF FIRST EMBODIMENT

COLUMN SWITCH SIGNAL CIRCUIT IN A SPECIFIC EXAMPLE OF FIRST EMBODIMENT

FIG. 7 DIAGRAM ILLUSTRATING A PRINCIPLE ACCORDING TO SECOND EMBODIMENT

FIG. 8  MEMORY CELL SECTION IN A SPECIFIC EXAMPLE ACCORDING TO SECOND EMBODIMENT

FIG. 9  TIME CHART SHOWING A WRITE OPERATION IN A SPECIFIC EXAMPLE OF SECOND EMBODIMENT

DATA BUS SHORT CIRCUIT IN A SPECIFIC EXAMPLE OF SECOND EMBODIMENT

FIG. 11  WRITE AMPLIFIER IN A SPECIFIC EXAMPLE OF SECOND EMBODIMENT

DIAGRAM ILLUSTRATING A PRINCIPLE ACCORDING TO THIRD EMBODIMENT

FIG. 13  MEMORY CELL SECTION IN A SPECIFIC EXAMPLE ACCORDING TO THIRD EMBODIMENT

FIG. 14 TIME CHART SHOWING A WRITE OPERATION IN A SPECIFIC EXAMPLE OF THIRD EMBODIMENT

COLUMN SWITCH SIGNAL CIRCUIT IN A SPECIFIC EXAMPLE OF THIRD EMBODIMENT

DATA BUS SHORT CIRCUIT IN A SPECIFIC EXAMPLE OF THIRD EMBODIMENT

FIG. 17    DATA BUS SHORT SIGNAL CIRCUIT IN A SPECIFIC EXAMPLE OF THIRD EMBODIMENT
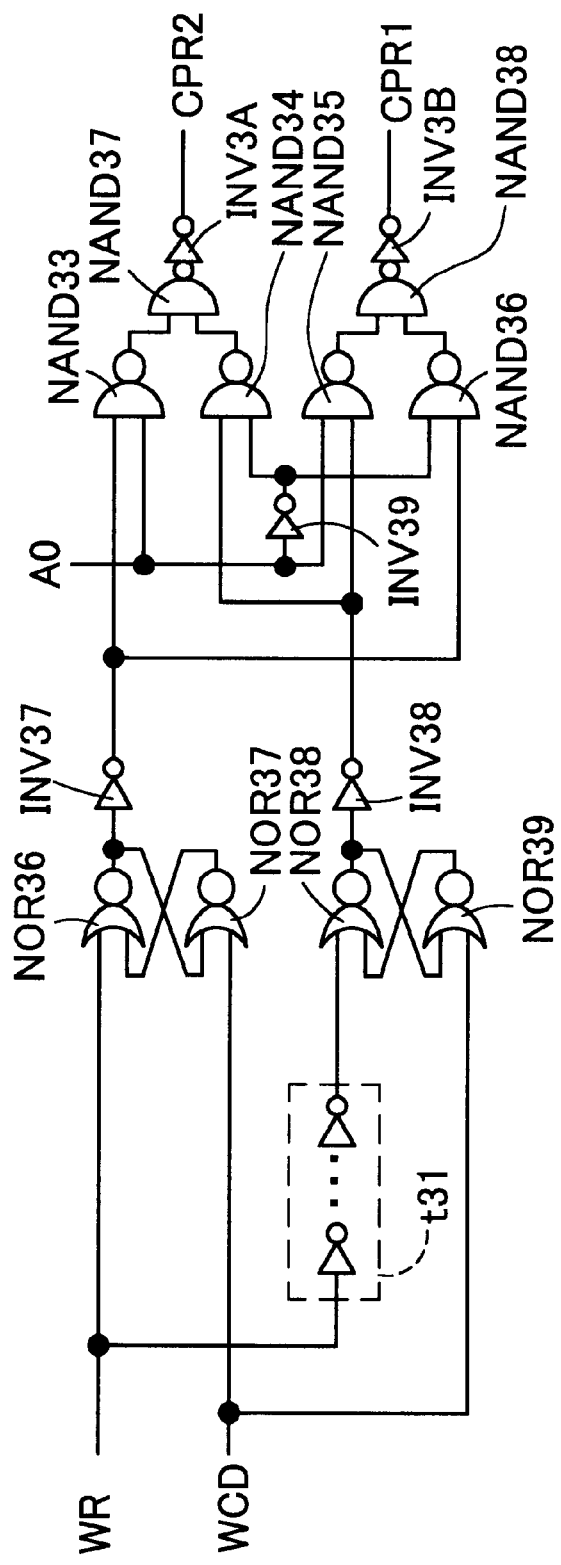

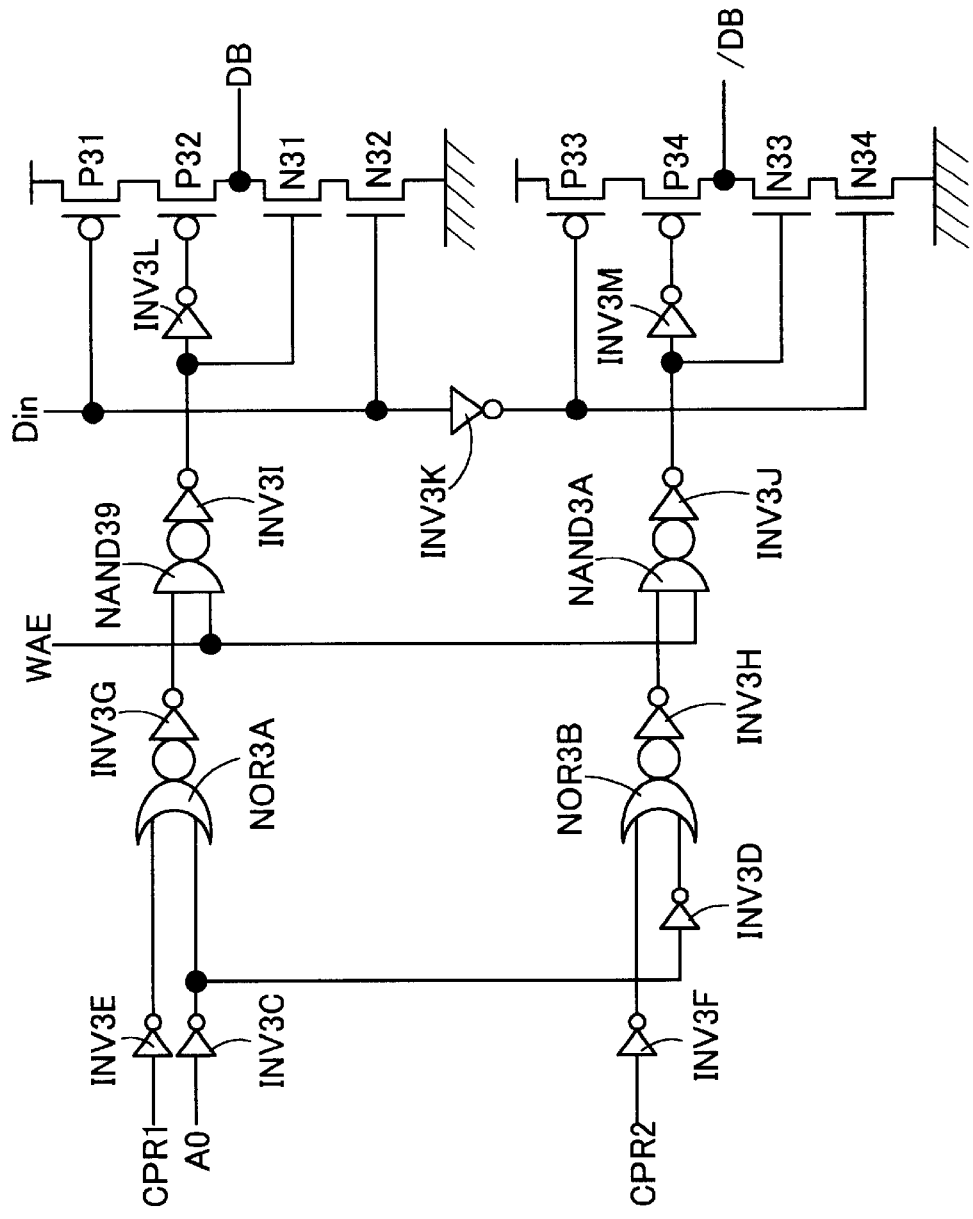
FIG. 18 WRITE AMPLIFIER IN A SPECIFIC EXAMPLE OF THIRD EMBODIMENT

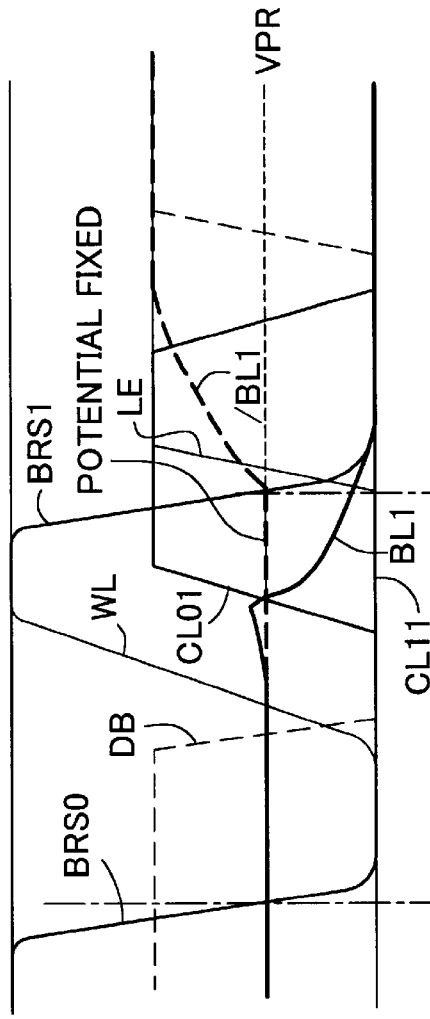
FIG. 19A AN IMPROVED WRITE OPERATION WAVEFORM (SPECIFIC EXAMPLE OF FIRST EMBODIMENT)
SELECTIVE BIT LINE (WRITE)
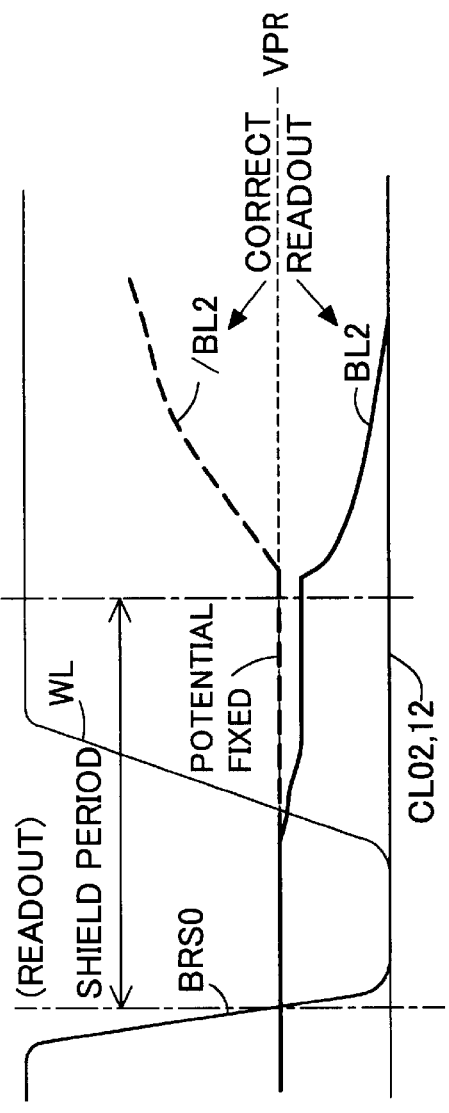
FIG. 19B
ADJACENT BIT LINE (READOUT)

MEMORY CELL SECTION IN A CONVENTIONAL SEMICONDUCTOR INTEGRATED CIRCUIT DEVICE

DIAGRAM ILLUSTRATING A PARASITIC CAPACITY BETWEEN BIT LINES OF A MEMORY CELL SECTION

FIG. 23A  PRIOR ART
EFFECT OF A WRITE NOISE IN PRIOR ART
SELECTIVE BIT LINE (WRITE)
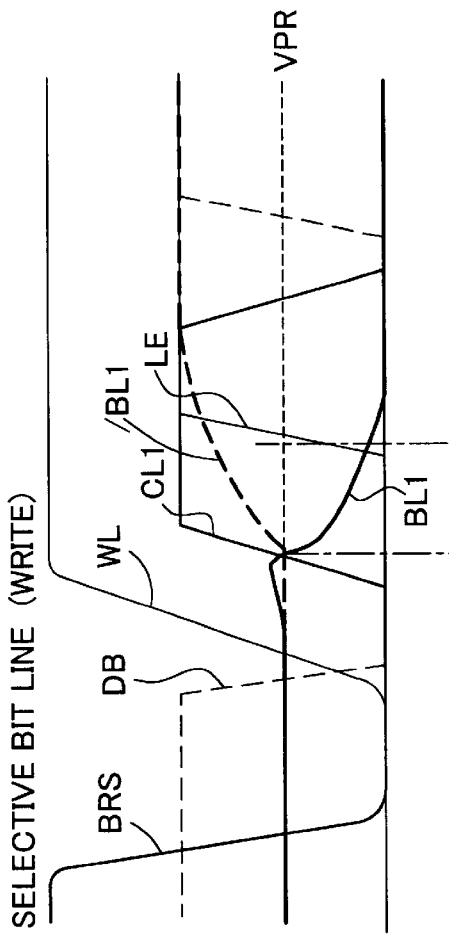
FIG. 23B  ADJACENT BIT LINE (READOUT)
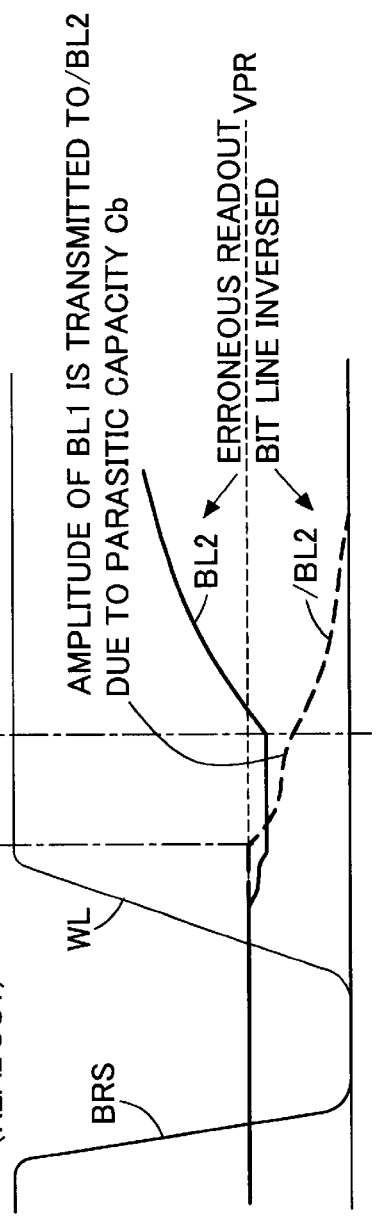

SEMICONDUCTOR INTEGRATED CIRCUIT DEVICE AND DATA WRITING METHOD THEREFOR

BACKGROUND OF THE INVENTION

1. Field of the Invention

The present invention relates to data writing into a memory cell in a semiconductor integrated circuit device. More particularly, the present invention relates to reduction of noise caused by a writing operation.

2. Description of the Related Art

With advancement of recent computer technology, as in depicting of a three-dimensional moving picture, there has been a need for a memory applicable to graphics use in which an address cycle irregularly changes. As a result, a high speed random access performance is required irrespective of a data readout cycle or a write cycle. However, as in a dynamic random access memory (hereinafter, referred to as a DRAM) or a synchronous type semiconductor memory device represented by a synchronous DRAM (hereinafter, referred to as a SDRAM), in a memory of such type multiplexing row addresses and column addresses, thereby inputting them at a separate timing, a high speed random access performance of such type cannot be achieved.

Because of this, as a high speed memory achieving a high cycle time performance of a static random access memory (hereinafter, referred to as a SRAM) while utilizing high integrity of DRAM or SDRAM, there has been devised a memory that determines a readout cycle or a write cycle by inputting addresses without multiplexing them, and by one command signal. A fast cycle random access memory (FC RAM (registered trademark)) is obtained as a typical device.

A memory cell section 1000 shown in FIG. 20 is a specific example showing a configuration of a high speed memory. Required constituent elements are excerpted for the purpose of explanatory convenience, and part of the high speed memory is shown. Memory cells Ta to Td are connected to bit lines /BL1, /BL2, BL1, and BL2. The data stored in the memory cell Ta to Td is read out as a stored charge, and the read data is redistributed into the bit lines /BL1, /BL2, BL1, or BL2. Then, bit line pair BL1 and /BL1 and bit line pair BL2 and /BL2 are paired, and the data are amplified by means of sense amplifiers SA and SAM. The amplified data is posted to data buses DB and /DB via a pair of column switches TN1 and TN2 and a pair of column switches TN3 and TN4, and amplified by means of read amplifier RA to output (Dout). Conversely, input data Din is amplified by means of a write amplifier WA, and the amplified data is stored by being stored as a charge in the memory cells Ta to Td from the data buses DB and /DB via bit lines BL1 , /BL2, BL1, or BL2.

Selection of the memory cells Ta to Td to be connected to the bit lines /BL1, /BL2, BL1, or BL2 is as follows. First, a row control circuit RC receives an internal command signal CMD generated in accordance with a readout or write cycle determined by an external one command signal (not shown), and an active signal ACT and a precharge signal PRE are output. Of these signals, these sent to a word decoder WD activates or deactivates the word decoder WD, and initiates word lines WL and WLM. In addition, those input to a sense amplifier signal circuit SC activates the same amplifiers SA and SAM to control an activation signal LE.

Apart from the shown memory cells Ta and Td, a number of memory cells (not shown) are connected to bit lines BL1 and /BL1 or the like, and these memory cells are sequentially selected by means of a word line (not shown) selected by the word decoder WD based on the row address signals ADRn (n=1, 2, . . . ). Therefore, it is required to short bit line pair BL1 and /BL1 or the like every memory cell access, and precharge these pairs at a predetermined voltage (VPR). This precharge operation is carried out by bit line short circuits BS and BSM. The bit line short circuits BS and BSM are controlled by a bit line short signal BRS from a bit line short signal circuit BSS based on the active signal ACT and the precharge signal PRE from the row control circuit RC.

In addition, the column switch signal circuits CS and CSM receive control signals WC and WCD output from a column control circuit CC based on an internal command signal CMD and a column address signals ADCn (n=1, 2, . . . ), and outputs switch signals CL1 and CL2 as required according to the column address signals ADCn (n=1, 2, . . . ). In this manner, the column switch TN1 to TN4 are conductive or nonconductive.

It is required to short and precharge the data buses DB and /DB by every readout or write cycle as in the bit line pair BL1 and /BL1 or the like. This precharge operation is carried out by a data bus short circuit DBS. The data bus short circuit DBS is controlled by a data bus short signal CPR from a data bus short signal circuit DBSS based on the control signals WR and WCD from the column control circuit CC.

FIG. 21 is a time chart showing a write operation for a memory cell section 1000 of the prior art. At a time t0, an internal command signal CMD is output, a row control circuit RC is initiated, and an active signal ACT is output (time t1). A bit line short signal BRS is deactivated by this signal ACT, and bit line precharge period terminates (time t1). In addition, a word line WL is selected by means of a word decoder WD, and memory cells Tc and Td are connected to the bit lines BL1 and BL2 (time t2). In this manner, the stored charge of the memory cells Tc and Td is started to be redistributed into the bit lines BL1 and BL2. FIG. 21 shows a case in which data "1" and "0" are written into the memory cells Tc and Td. Therefore, the bit line BL1 rises from a precharge voltage VPR, and conversely, the bit line BL2 falls.

In a process in which the stored charge from the memory cells Tc and Td selected by the word line WL is redistributed to each of the bit lines BL1 and BL2, a second internal command signal CMD is issued. This second command signal CMD is an internal command signal internally generated in the case where an external one command (not shown) is a write command. After this signal has been output, the column control circuit CC is initiated, and a control signal WR is output. In addition, a data bus short signal circuit DBSS deactivates a data bus short signal CPR, and terminates a precharge period of the data buses DB and /DB. In addition, this circuit activates a write amplifier WA by means of an activation signal WAE, and amplifies write data between data buses DB and /DB (time t3).

At a time t4 delayed from the time t3, the control signal WC output from the column control circuit CC works as trigger to make a switch signal CL1 output from a column switch signal circuit CS that corresponds to column address signals ADCn (n=1, 2, . . . ) active, and make column switches TN1 and TN2 conductive. As a result, the data buses DB and /DB and the bit lines BL1 and /BL1 are interconnected to each other, and the preceding write data amplified in the data buses DB and /DB are written into the bit lines BL1 and /BL1.

A potential difference between bit line pair BL1 and /BL1 is amplified by being driven by the write amplifier WA. On the other hand, the stored charge of the memory cell Td or the like is redistributed between the memory cell Td or the like and bit line BL2 or the like into the other bit line pair containing the adjacent bit line pair BL2 and /BL2. The bit line /BL2 or the like in which a memory cell is not selected is kept to be a precharge voltage VPR, and thus, a potential difference between the bit line pair BL2 and /BL2 gradually increases. Then, after this potential difference has reached the amplification sensitivity of the sense amplifier SAM, an activation signal LE is set to its logical level "high" by means of the sense amplifier signal circuit SC. As a result, the sense amplifier SAM is driven, and the bit line pair BL2 and /BL2 is amplified (time t5). At this time, a potential difference between the bit line pair BL2 and /BL2 is about some tens of mV. The memory cells Ta to Td are memory cells of such type comprising a capacitor element as a memory element, and storing a charge in this capacity element, thereby storing data. A memory cell of such type requires a so-called refresh operation for replenishing a stored charge periodically. Therefore, in a data write cycle as well, it is general to make a refresh operation in line with the memory cell Td in which no data writing is carried out, of the selected memory cells Tc and Td.

After amplification, a control signal WCD is output from the column control circuit CC at a proper timing, and the output signal is input to the column switch signal circuit CS. In this manner, a switch signal CL1 is deactivated, and an activation signal WAE of a write amplifier WA is deactivated (time t6). Concurrently, a data bus short signal CPR is activated, and the data buses DB and/DB are precharged. A third command signal is output at a predetermined timing by means of an internal command signal CMD, and a precharge signal PRE is outputted from the row control circuit RC. The word line WL and activation signal LE of sense amplifiers SA and SAM are deactivated by means of the precharge signal PRE, and a bit line short signal BRS is activated. In this manner, the bit lines BL1, /BL1, BL2, and /BL2 are precharged, and a write cycle terminates.

FIG. 22 shows parasitic capacities existing between bit lines. At the memory cell section 1000 in the semiconductor integrated circuit device, memory cells containing memory cells Tc, Td, and Te or the like are disposed with high integrity, and thus, the bit lines BL1, /BL1, BL2, /BL2, BL3, and /BL3 or the like connected to these memory cells Tc, Td, and Te or the like run in parallel with each other adjacently. Therefore, parasitic capacity Cb exists between bit line pair and between the adjacent bit lines.

The following description will be given with respect to an effect on noise in the case where a write operation is carried out in a memory cell Tc. In more detail, an effect of noise caused by a write operation for the adjacent bit line /BL2 due to an effect of the parasitic capacity Cb will be described with reference to FIG. 23. FIG. 23A shows a time chart of writing in a bit line pair between a selected bit line BL1 and a complementary bit line /BL1 to which a memory cell Tc into which data is to be written is connected. FIG. 23B shows a time chart of readout from a memory cell Td for a refresh operation carried out in line with the adjacent bit line pair BL2 and /BL2.

When a bit line short signal BRS is deactivated, and a word line WL is activated, the stored charge is started to be redistributed into each of the bit lines BL1 and BL2 from the selected memory cells Tc and Td. Here, data "1" is stored in the memory cell Tc, and thus, a potential of the bit line BL1 is started to rise. In addition, data "0" is stored in the memory cell Td, and thus, a potential of the bit line BL2 is started to fall. Next, a switch signal CL1 is activated, and column switches TN1 and TN2 are made conductive. Further, for the purpose of a write operation for the memory cell Tc, data buses DB and /DB, whose data for writing is amplified at a proper timing with activation of the word line WL and bit lines BL1 and /BL1 are connected. Here, because of "0" data writing, a potential of the bit line BL1 is inverted by means of a write amplifier (WA in FIG. 20), and is set to a low level side. At this stage, the adjacent bit line BL2 is in the way of redistributing the stored charge from the memory cell Td. Since a potential difference between the bit line pair BL2 and /BL2 does not reach amplification sensitivity of the sense amplifier SAM, the sense amplifier SAM is in an inactive state. That is, the bit lines BL2 and /BL2 are in a floating state.

The bit line BL1 set to the low level side and the bit line /BL2 in a floating state are adjacent, and the parasitic capacity Cb being a line parasitic capacity exists. Because of this, a voltage transition of the bit line BL1 is transmitted to be capacity coupled with the adjacent bit lines /BL2 as well. The voltage transition quantity of the adjacent bit line /BL2 is determined depending on the voltage transition quantity of the bit line BL1 caused by the amplification strength of the write amplifier WA, a potential difference between the adjacent bit line pair BL2 and /BL2, and a parasitic capacity Cb or the like. As a result, a potential difference between the adjacent bit line pair BL2 and /BL2 is reversed by means of an activation signal LE of the sense amplifier SAM, and is amplified, and readout of the stored charge may be reversed, which is problematic.

This write noise does not always occur only between the adjacent bit lines. The easiness of noise propagation or the like changes variously due to manufacturing factors such as layout position relationship between a memory cell and a bit line, difference in dielectric constant of interline oxide film, or thickness of a metal wired layer.

With advancement of higher integrity and higher speed of a semiconductor integrated circuit device, an effect of a write noise relevant to the adjacent bit lines is serious, which is problematic.

SUMMARY OF THE INVENTION

The present invention has been made in order to solve the foregoing problem with the prior art. It is an object of the present invention to provide a semiconductor integrated circuit device capable of, when a data writing operation for a memory cell is carried out by being embodied in a period during data readout from the memory cell for the adjacent bit lines, clamping a complementary bit line side of the adjacent bit line pair to a predetermined voltage, thereby reducing an effect of a write noise in a read operation for the adjacent bit lines, and making a constant operation.

In order to achieve the foregoing object, a semiconductor integrated circuit device according to one aspect of the present invention comprises a plurality of memory cells, a plurality of word lines, and a plurality of bit line pairs, and further comprises a voltage fixing section for fixing to a predetermined voltage at least one bit line excluding a predetermined bit line or at least one bit line excluding the complimentary bit line of the predetermined bit line when data is written into the predetermined bit line or a complementary bit line of the predetermined bit line.

In addition, a data writing method of a semiconductor integrated circuit device according to one aspect of the present invention, comprising: memory cells selected by a word line being activated; bit lines provided for each of the memory cells, and connected to the memory cells by selecting the word line, and complementary bit lines paired with the bit lines for amplifying data input from/output to the memory cell, the method comprising the voltage fixing step of, when data is written into a predetermined bit line or complementary bit line of the predetermined bit line, fixing to a predetermined voltage a plurality of complementary bit lines containing a complementary bit line of the predetermined bit line or a plurality of bit lines containing the predetermined bit line.

In the semiconductor integrated circuit device according to one aspect of the present invention, when data is written into a predetermined bit line or a complementary bit line of the predetermined bit line, a complementary bit line of the adjacent predetermined bit line to the predetermined bit line or a predetermined bit line adjacent to a complementary bit line of the predetermined bit line is set to a predetermined voltage by means of the voltage fixing section.

In this manner, a complementary bit line or a bit line that exist between the bit line or the complementary bit line to which a memory cell targeted for writing is connected and the adjacent bit lines or the adjacent complementary bit lines in which the stored charge is redistributed from a memory cell for the purpose of a refresh operation is fixed to a predetermined voltage. As a result, the capacity coupling caused by a voltage transition of a write bit line or write complementary bit line is shielded, thereby, a voltage transition can be prevented from being extended to the adjacent bit line or adjacent complementary bit line.

With advancement of a high integrity or high speed of a semiconductor integrated device, even if the parasitic capacity between the adjacent bit line and the complementary bit line or the adjacent complementary bit line and the bit line is increased, an effect caused by a write noise can be reliably prevented.

The above and further objects and novel features of the invention will more fully appear from following detailed description when the same is read in connection with the accompanying drawings. It is to be expressly understood, however, that the drawings are for the purpose of illustration only and are not intended as a definition of the limit of the invention.

BRIEF DESCRIPTION OF THE THE DRAWINGS

FIG. 17 is a circuit diagram depicting a data bus short signal circuit in a specific example of the third embodiment;

FIG. 18 is a circuit diagram depicting a write amplifier in a specific example of the third embodiment;

FIGS. 19A and 19B is a waveform chart depicting an improved write operation waveform (in the case of a specific example of the first embodiment);

FIGS. 23A and 23B is a waveform chart showing an effect of a write noise in the prior art.

DETAILED DESCRIPTION OF THE PREFERRED EMBODIMENTS

Hereinafter, preferred embodiments 1 to 3 embodied in a semiconductor integrated circuit device of the present invention will be described with reference to the accompanying drawings based on FIG. 1 to FIG. 19. In specific examples of the first to third embodiments described below, a description will be given with respect to an case in which selection of a memory cell and readout/writing of data from the memory cell are carried out by one command entry.

Figure 1:
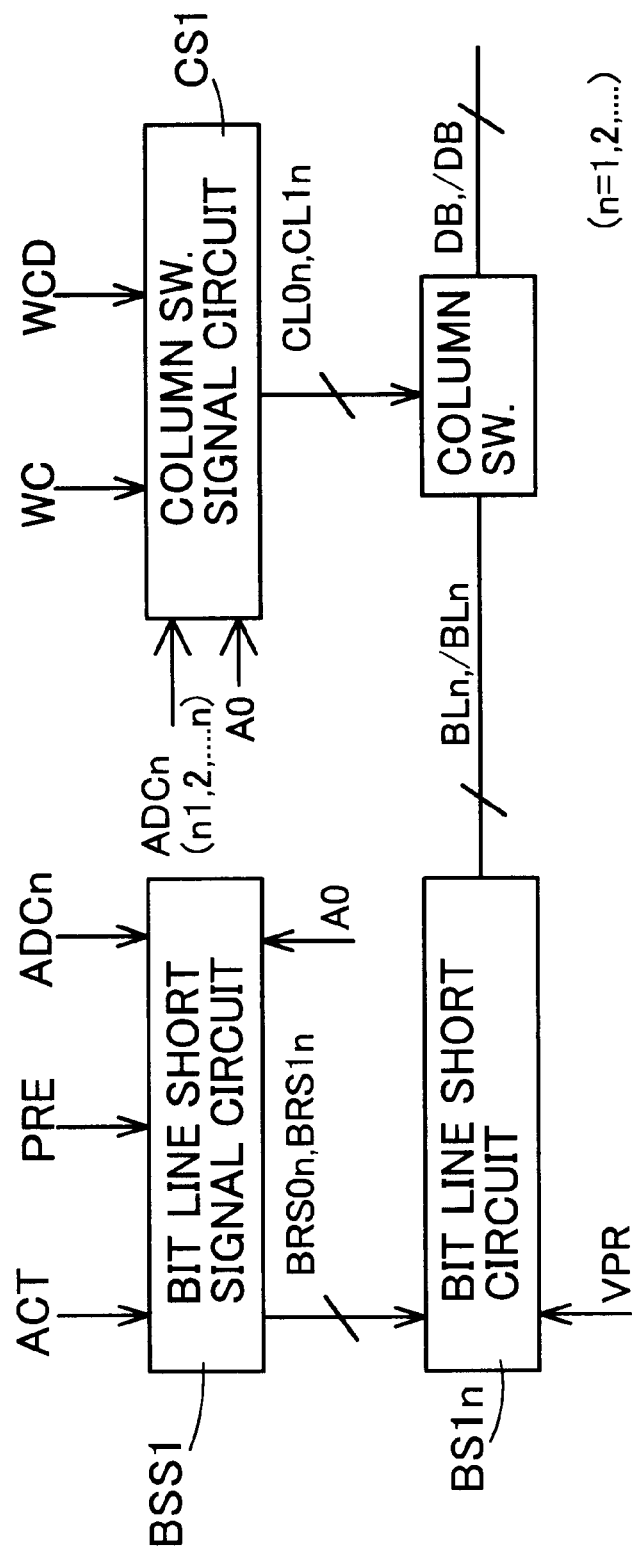
FIG. 1 is a view illustrating a principle according to a first embodiment of the present invention.

In the illustrative view 1 illustrating a principle of operation according to the first embodiment as shown in FIG. 1, to a bit line short signal circuit BSS1, apart from an active signal ACT and a precharge signal PRE, a column address signals ADCn (n=1, 2, . . . ) for specifying column addresses for performing write operation and an address signal A0 for determining which bit line of a set of bit line pair BLn and /BLn (n=1, 2, . . . ) is selected are input. From among these signals, the corresponding bit line short signals BRS0n, BRS1n (n=1, 2, . . . ) are selectively activated, and is input to a bit line short circuits BS1n (n=1, 2, . . . ), and the corresponding bit line is shorted, and is fixed to a predetermined voltage VPR during a predetermined time. On the other hand, a column address signals ADCn and an address signal A0 are input to a column switch signal circuits CS1n (n=1, 2, . . . ) similarly, which are controlled by means of control signals WC and WCD, and column switch signals CL0n and CL1N (n=1, 2, . . . ) are output. One of the corresponding bit lines BLn and /BLn and the corresponding data buses DB and /DB are connected by these column switch signals CL0n and CL1n, and writing into a bit line is started.

At this time, bit line short signals BRS0n and BRS1n from the bit line short signal circuit BSS1 are selected so as to shield a write noise that corresponding to the written, selected bit lines BLn and /BLn. For example, only two complementary bit lines /BLn and BLn adjacent to the written, selected bit lines BLn and /BLn can be selected so as to be fixed to a predetermined voltage VPR. In addition, a range of fixing to a predetermined voltage VPR can be further expanded and set.

According to the illustrative view 1 illustrating a principle of operation of the first embodiment, the complementary bit line /BLn or BLn that exists between bit line BLn or /BLn to which a memory cell targeted for writing is connected and the adjacent bit line BLn or /BLn in which redistribution of the stored charge from the memory cell is carried out for the purpose of refresh operation is fixed to predetermined voltage VPR. Because of this, the capacity coupling between bit lines containing the complementary bit line BLn or /BLn caused by the voltage transition of written bit line BLn or /BLn is shielded, and a noise caused by a voltage change can be prevented from being extended to the adjacent bit lines BLn or /BLn.

In addition, the complementary bit lines /BLn or BLn fixed to a predetermined voltage VPR are set to the complementary bit lines /BLn or BLn containing but without being limited to both ends of a write bit line BLn or /BLn. By setting this, even in the case where an influence caused by a write noise is affected to a bit line other than the adjacent bit lines by manufacturing factors such as the layout between the memory cell and each of the bit line BLn or /BLn, a difference in dielectric constant of interline oxide film, and thickness of a metal wire layer, noise propagation or reverse of a potential difference between bit line pairs can be prevented.

With advancement of higher integrity and high speed of a semiconductor integrated circuit device, even if a parasitic capacity between the adjacent bit lines is increased, an effect caused by a write noise can be reliably prevented.

Figure 2:
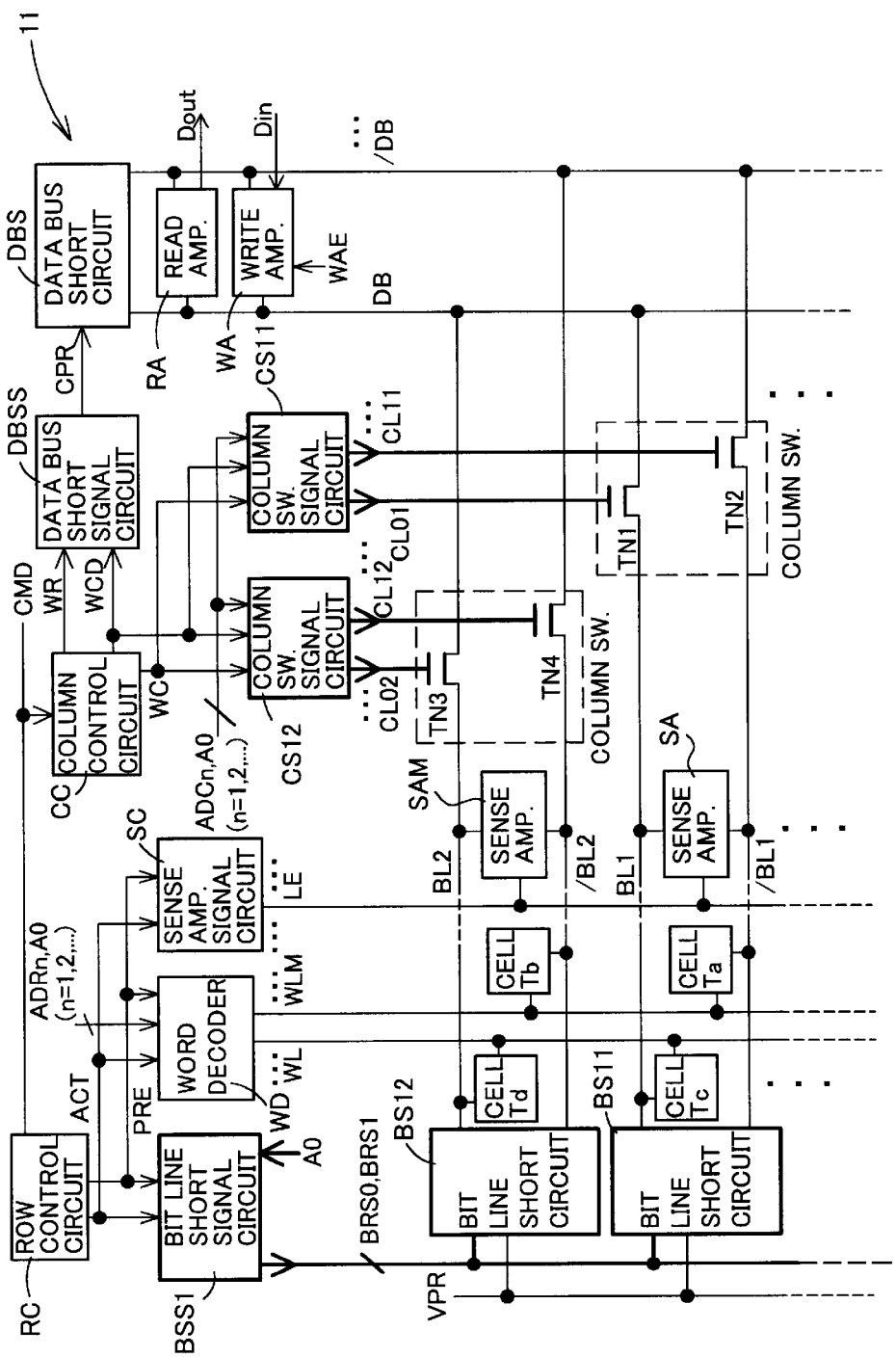
FIG. 2 is a block diagram depicting a circuit that shows a memory cell section in a specific example according to the first embodiment.
Figure 20:
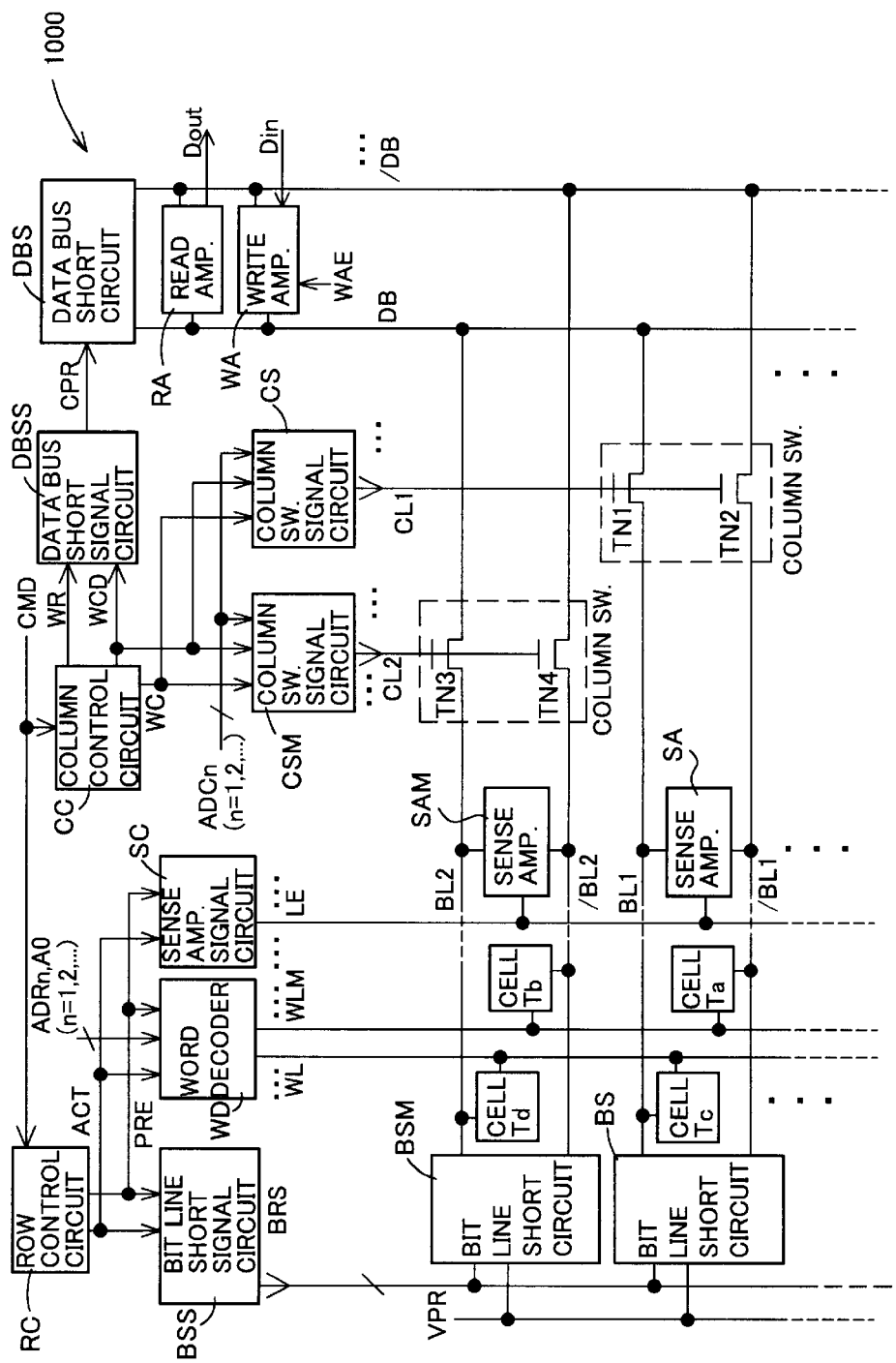
FIG. 20 is a circuit block diagram depicting a memory cell section in a conventional semiconductor integrated circuit device.

A memory cell section 11 in a specific example of the first embodiment shown in FIG. 2 comprises: a bit line short signal circuit BSS1, bit line short circuits BS11 and BS12, and column switch signal circuits CS11 and CS12 instead of a bit line short signal circuit BSS, bit line short circuits BS and BSM, and column switch signal circuits CS and CSM of a memory cell section 1000 of the prior art shown in FIG. 20. An address signal A0 as well as an input signals in the prior art is further input to the bit line short signal circuit BSS1 and column switch signal circuits CS11 and CS12. An address signal A0 is a signal that determines memory cells Tc and Ta, Td and Tb connected to a bit line in which one of a set of bit line pairs BL1 and /BL1, BL2 and /BL2 are selected. When the address signal A0 is set to its logical level, "low", the memory cells Tc, Td connected to the bit lines BL1, BL2 are selected, and the corresponding bit line short signal BRS0 and column switch signal CL01 are selectively output. In selecting the column switch signal CL01, a column address signals ADCn are selected at the same time. At the memory cell section 11, a column address signals ADCn as shown in the illustrative view 1 illustrating a principle shown in FIG. 1 is not input to the bit line short signal circuit BSS1, and control for changing the adjacent complementary bit lines to be fixed to a predetermined voltage VPR corresponding to a write bit line is not carried out. Of a set of bit line pairs BL1 and /BL1, BL2 and /BL2, bit lines free of writing are batch selected as a complementary bit lines, and are fixed to a precharge voltage VPR that is a determined voltage, whereby shielding of a write noise is carried out. Bit line short circuits BS11 and BS12 are circuits for precharging bit lines BL1 and BL2 or bit lines /BL1 and /BL2 to be fixed to precharge voltage VPR corresponding to bit line short signals BRS0 and BRS1.

An address signal A0 as well an input signals in the prior art is further input to column switch signal circuits CS11 and CS12. Of a bit line pair BL1 and /BL1 or a bit line pair BL2 and /BL2 selected by means of the column address signals ADCn, a bit line BL1, /BL1, BL2, or /BL2 to which memory cells Tc, Ta, Td, or Tb is connected corresponding to the address signal A0 is connected to a data bus DB or /DB, and thus, column switch signal CL01, CL11, CL02, or CL12 is activated, which makes the corresponding a column switch TN1, TN2, TN3, or TN4 conductive.

Figure 4:
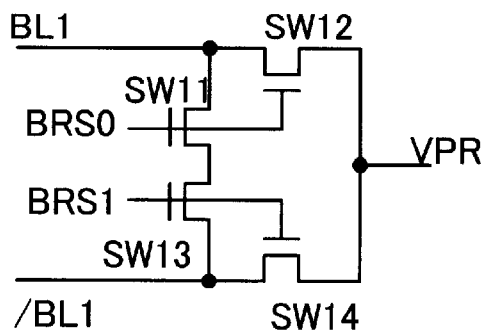
FIG. 4 is a circuit diagram depicting a bit line short circuit in a specific example of the first embodiment.

Hereinafter, a specific circuit example of individual circuit blocks will be described. FIG. 4 is a circuit example of bit line short circuits BS11 and BS12. In FIG. 4, although a description is given by exemplifying a bit line pair BL and /BL1, a similar circuit configuration is obtained in another bit line pair as well. In order to short between bit line pair BL1 and /BL1, NMOS transistors SW11 and SW13 are connected in series, each of which is controlled by means of bit line short signals BRS0 and BRS1. Further, bit lines BL1 and /BL1 are connected to a precharge voltage VPR by means of NMOS transistors SW12 and SW14 controlled by means of the bit line short signals BRS0 and BRS1.

When bit line short signals BRS0 and BRS1 are activated together, bit line pair BL1 and/BL1 is shorted. In addition, bit lines BL1 and /BL1 each are set to a precharge voltage VPR, and bit lines BL1 and /BL1 are in a precharge state. On the other hand, when either one of the bit line short signals BRS0 and BRS1 is activated, bit line pair BL1 and /BL1 is not shorted. While in an open circuit state, either one of the bit lines BL1 and /BL1 can be set to a precharge voltage VPR. Further, if the bit line short signals BRS0 and BRS1 are inactivated together, all the NMOS transistors SW11 to SW14 are in a nonconductive state, and normal readout/write state can be established.

Figure 5:
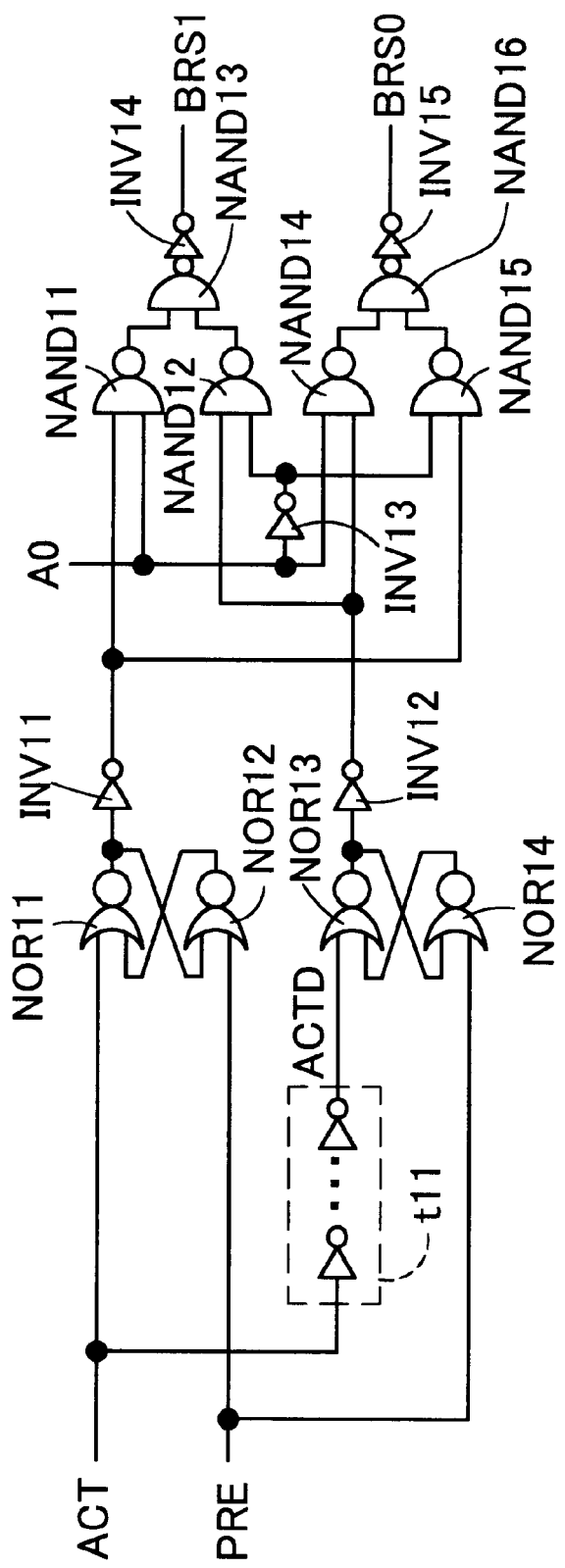
FIG. 5 is a circuit diagram depicting a bit line short signal circuit in a specific example of the first embodiment.

FIG. 5 is a circuit example of a bit line short signal circuit BSS1. In FIG. 5, the input signals of the first and those of the second latch circuits configured by cross-coupling and connecting the NOR gates NOR11 and NOR12, NOR gates NOR13 and NOR14 respectively are an active signal ACT of a positive pulse as a set signal, and a precharge signal PRE of a positive pulse as a reset signal. The output signal of each of the latch circuits is inverted by means of each of the inverters INV11 and INV12, and is configured so that its logical level "high" is obtained during setting. However, a set input signal ACTD of a second input latch circuit is generated via a timing setting section t11 that configures a delay circuit by connecting inverter gates from an active signal ACT in predetermined even numbers.

A NAND gate NAND 15 in which an output signal of a first latch circuit and an invert signal of an address signal A0 via an inverter INV 13 are input and a NAND gate NAND14 in which the output signal of a second input latch circuit and an address signal A0 are input generate a bit line short signal BRS0 via a NAND gate NAND 16 and an inverter INV 15. Similarly, a NAND gate NAND 11 to which the output signal of the first input latch circuit and an address signal A0 are input, and a NAND gate NAND12 to which an output signal of a second latch circuit and an invert signal of the address signal A0 via the inverter INV 13 are input generate a bit line short signal BRS1 via the NAND gate NAND 13 and inverter INV 14.

A first input latch circuit is set by means of an active signal ACT of a positive pulse to output its logical level signal "high", and is reset by a precharge signal PRE of a positive pulse. At the second input latch circuit, although a reset signal is obtained as a precharge signal PRE of a positive pulse in the same way as a first input latch circuit, a set signal is obtained as a signal ACTD having a delay of a predetermined time via a timing setting section t11 from an active signal ACT of a positive pulse. Its logical level signal "high" is output after set by means of the delay signal ACTD.

Here, the NAND gate NAND 13 and inverter INV 14, the NAND gate NAND 16 and inverter INV 15 configure logical products. Therefore, a bit line short signal BRS0 is obtained as its logical level "high", and is activated when outputs of the NAND gate NAND14 and NAND15 each set to its logical level "high". Similarly, the bit line short signal BRS1 is obtained as its logical level "high", and is activated when outputs of the NAND gates NAND 11 and NAND 12 each are set to its logical level "high". When the first and second input latch circuits are in a reset state upon the receipt of a precharge signal PRE, output signals of the first and second input latch circuits each are set to its logical level "low" irrespective of its logical level of an address signal A0, all of the output signals of the NAND gates NAND 11, 12, 14, and 15 are set to its logical level "high", bit line short signals BRS0, BRS1 are set to its logical level "high", all the bit lines each are set to a precharge state.

In the case where an active signal ACT has been received, a first input latch circuit is first set. If an address signal A0 is set to its logical level, "low", an output signal of a NAND gate NAND 15 is status changed to its logical level "low", and a bit line short signal BRS0 is status changed to its logical level, "low", and is inactivated. If the address signal A0 is set to its logical level "high", the output signal of the NAND gate NAND 11 is status changed to its logical level "low", a bit line short signal BRS1 is status changed to its logical level "low", and is inactivated. That is, an active signal ACT is input to enter an access state, and a precharge operation for a bit line connected to a memory cell selected by the address signal A0 is released. Further, after an elapse of a delay time by a timing setting section t11, a second input latch circuit is set, and the output signal is inverted into its logical level "high". Upon the receipt of this, if the address signal A0 is set to its logical level "low", the output signal of NAND gate NAND12 is status changed to its logical level "low". Then, the bit line short signal BRS1 is status changed to its logical level "low", and is inactivated. If the address signal A0 is set to its logical level "high", an output signal of the NAND gate NAND14 is status changed to its logical level "low", bit line short signal BRS0 is status changed to its logical level "low", and are inactivated. If a delay time caused by the timing setting section t11 is set to a period of a noise shield caused by a write operation, during the delay time caused by the timing setting section t11, a nonselective bit lines to which memory cells are not connected can be fixed to a precharge voltage VPR.

Figure 6:
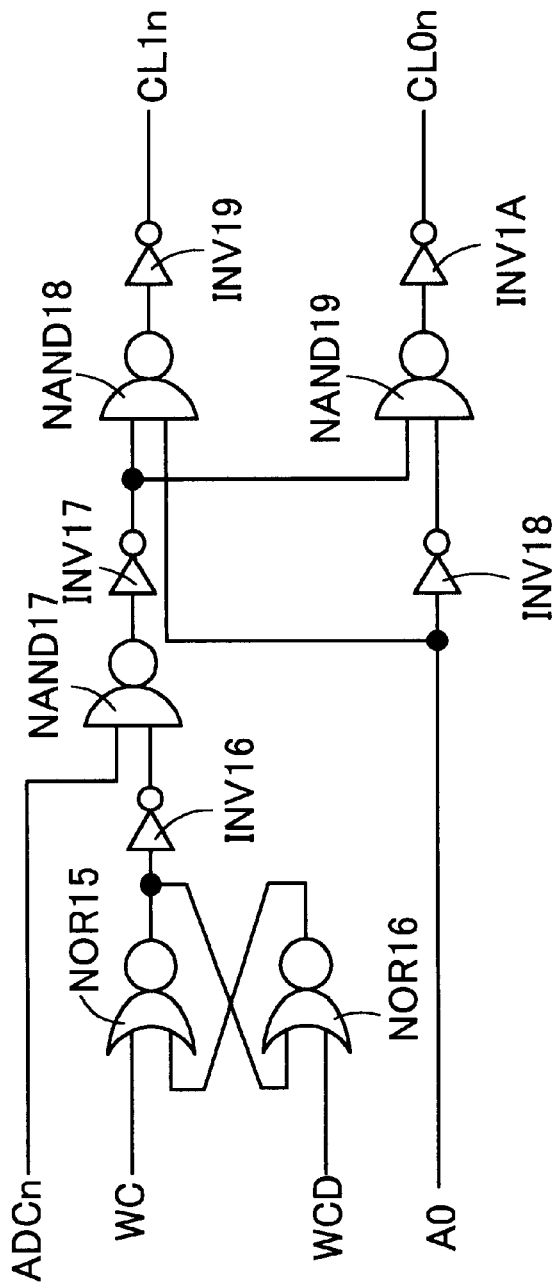
FIG. 6 is a circuit diagram depicting a column switch signal circuit in a specific example of the first embodiment.

FIG. 6 is a circuit example of column switch signal circuits CS11 and CS12. In FIG. 6, column switch signals CL0n and CL1n are generated as an output signal of each logical product composed of the NAND gate NAND19 and inverter INV1A, the NAND gate NAND18 and inverter INV19 respectively. An output signal of the inverter INV17 is input in common to the NAND gate NAND19 and the NAND gate NAND18. A signal obtained by inverting the address signal A0 by the inverter INV 18 and the address signal A0 are input each to the other input terminals. A column address signal ADCn is input to the inverter INV 17 via the NAND gate NAND 17, and an output signal of a third input latch circuit in which a control signal WC from the column control circuit CC is defined as a set signal, and a control signal WCD is obtained as a reset signal is input. A configuration of the third input latch circuit is composed of a cross couple connected NOR gates NOR 15, NOR 16, and an inverter INV16 as in a configuration of the first and second input latch circuits.

The column switch signal circuits CS11 and CS12 are provided for each column address signals ADCn, and the third input latch circuit is set upon the receipt of a control signal WC of a positive pulse from the column control circuit CC relevant to the corresponding column address signals ADCn. Then, column switch signals CL0n and CL1n are generated so as to connect a bit line having connected thereto a memory cell selected by the address signal A0 to a data bus. The generated column switch signals CL0n and CL1n are reset upon the receipt of the control signal WCD of a positive pulse from the column control circuit CC.

Figure 3:
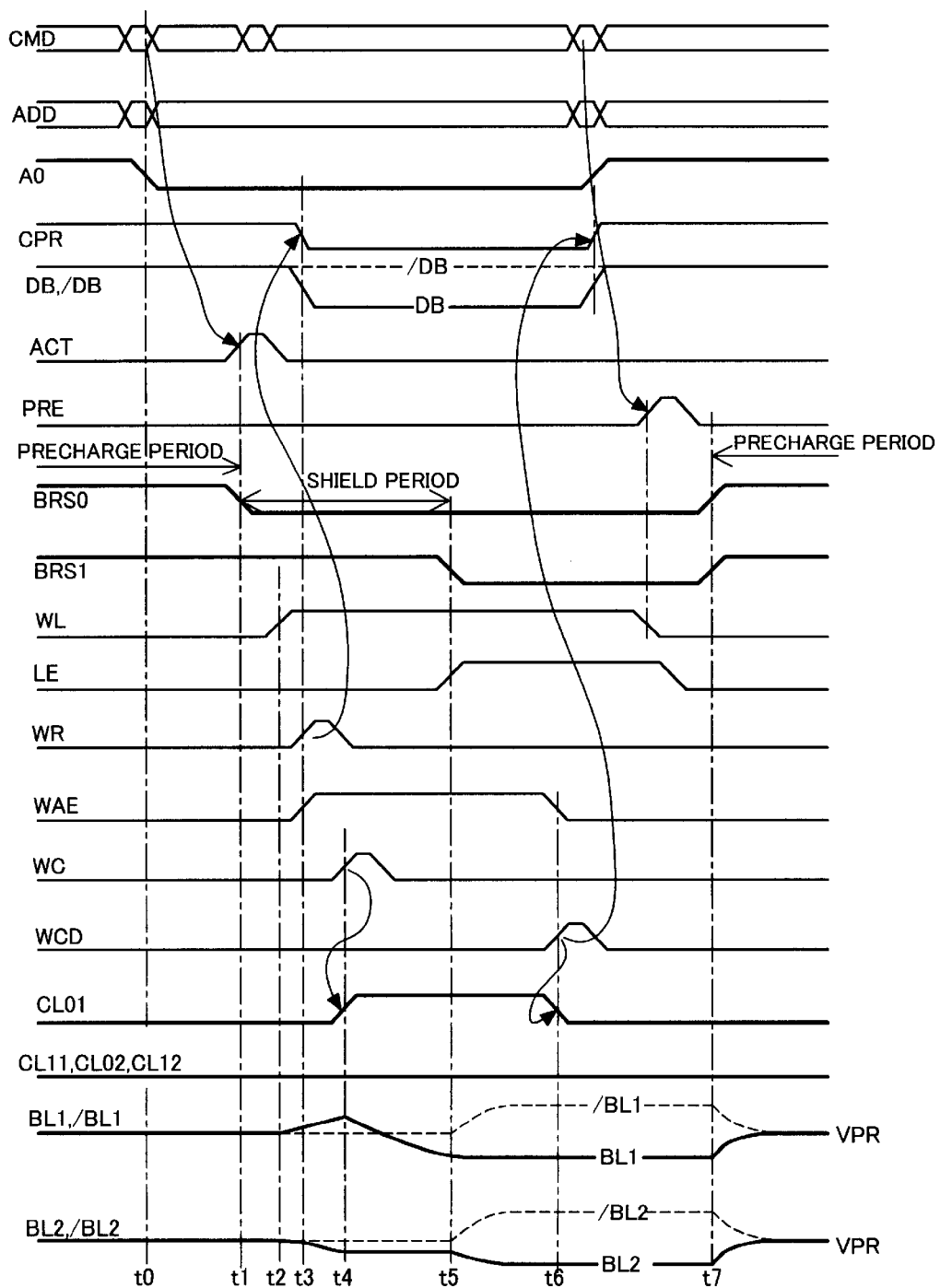
FIG. 3 is a time chart showing a write operation in a specific example of the first embodiment.

In a timing chart of a write operation shown in FIG. 3, after elapse of the precharge period caused by the active signal ACT, a bit line short signal BRS1 maintains its logical level "high" during predetermined period, and complementary bit lines /BL1 and /BL2 that are nonselective bit lines to which memory cells are not connected are fixed to a precharge voltage VPR, and a write noise is shielded. This time is defined as a shield period. In the shield period, a selective word line WL is activated, and the stored charge from the selected memory cells Tc and Td is redistributed to bit lines BL1 and BL2. At the same time, a data bus short signal CPR is released by means of a control signal WR of a positive pulse, a write amplifier WA is activated by means of an activation signal WAE, and write data (data "0" in FIG. 3) is amplified in the data buses DB and /DB.

Then, the amplified data is activated by means of the control signal WC of the positive pulse, and only the column switch signal CL01 is activated to make the column switch TN1 conductive. In addition, the bit line BL1 and data bus DB are connected with each other, and data is written into the bit line BL1. Data "1" is stored in the selected memory cell Tc. When the bit line BL1 is shifted to a high level side, write data is set to "0", and the data bus DB is shifted to its low level. Thus, the bit line BL1 is set to the low level side, and a write operation is carried out. This write state is carried out until a potential difference caused by writing of the bit line pair BL1 and /BL1 in which writing is carried out reaches the amplification sensitivity of the sense amplifier SA.

In this duration, in order that a refresh operation is carried out in another bit line BL2 at the same time, the stored charge from the memory cell Td is redistributed. And this distribution continues until the potential difference between the bit line pair BL2 and /BL2 has reached the amplification sensitivity caused by the sense amplifier SAM. In this state, the bit lines BL2 and /BL2 are set to its floating state. Then, the complementary bit lines /BL1 and /BL2 that are nonselective bit lines to which memory cells are not connected are fixed to a precharge voltage VPR. This is because a voltage transition caused by this write operation is prevented from propagating the adjacent bit line BL2 or the complementary bit lines /BL1 and /BL2 via the parasitic capacity Cb which results in incorrect data inversion. At a time when a potential difference between a voltage of all the selective bit lines BL1 and BL2 each containing the write bit line BL1 and a precharge voltage VPR that is a fixing voltage of the paired complementary bit lines /BL1 and /BL2 has reached a predetermined value, the sense amplifiers SA and SAM are activated by means of an activation signal LE, and amplification is carried out. The subsequent operation is similar to that of the prior art (refer to FIG. 21).

As has been described above, in a specific example 11 of the first embodiment, it is unnecessary to select complementary bit lines /BL1 and /BL2 to be fixed to a precharge voltage VPR that is a predetermined voltage corresponding to bit line BL1 to which write operation is carried out, and all the complementary bit lines /BL1 and /BL2 can be selected altogether. Thus, a configuration for selecting the complementary bit lines /BL1 and /BL2 can be simplified, and a write noise can be simply and reliably shielded.

In addition, the bit lines BL1 and BL2 connected to the selected memory cells Tc and Td and the complementary bit lines /BL1 and /BL2 corresponding to nonselective memory cells Ta and Tb each can be set to a precharge voltage VPR independently. Moreover, there is no need to select the complementary bit lines /BL1 and /BL2 to be fixed, corresponding to a write bit line BL1, and these bit lines can be selected altogether. Thus, all the complementary bit lines /BL1 and /BL2 are selected altogether during write operation, and is simply and reliably fixed to the precharge voltage VPR so that a write noise can be shielded. Further, a timing for being fixed to the precharge voltage VPR can be set, and thus, the complementary bit lines /BL1 and /BL2 are fixed to the precharge voltage VPR according to a period affected by the write noise so that a write noise can be properly shielded.

In particular, in the case where the bit lines BL1 and BL2 connected to memory cells Tc and Td that are selected memory cells and the complementary bit lines /BL1 and /BL2 corresponding to nonselective memory cells Ta and Tb are laid out alternatively, the voltage transition in the bit line BL1 for which write operation is carried out is simply and reliably shielded, and the voltage inversion of the adjacent bit lines /BL1, BL2, and /BL2 caused by a write noise can be prevented.

In addition, column switches TN1 and TN3, column switches TN2 and TN4 configuring a switch section and a complementary switch section can be driven independently. Thus, when write data from the data buses DB and /DB that are data lines are propagated to bit lines BL1, BL2, /BL1, and /BL2, for example, there is no need to connect to the complementary data bus /DB the complementary bit line /BL1 paired with a predetermined bit line BL1 connected to the data bus DB. Further, this complementary bit line /BL1 is fixed to its precharge voltage VPR so that a write noise for a predetermined bit line BL1 can be shielded.

Figure 7:
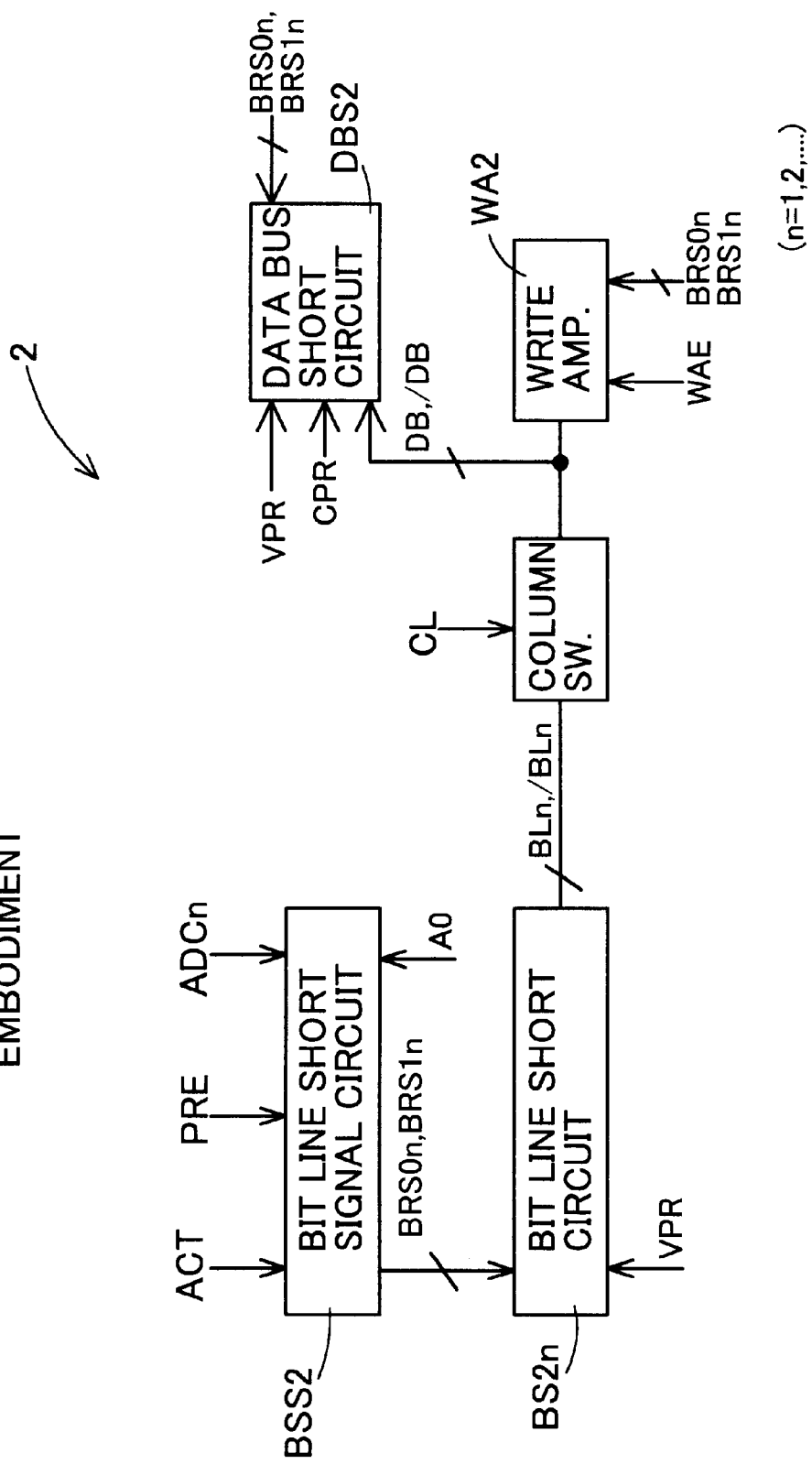
FIG. 7 is a view illustrating a principle according to a second embodiment of the present invention.

In the illustrative view 2 illustrating a principle of operation according to the second embodiment shown in FIG. 7, in a bit line short signal circuit BSS2, apart from the active signal ACT and the precharge signal PRE, column address signals ADCn (n=1, 2, ...) for specifying write column addresses and an address signal A0 for determining which bit line of a set of bit line pairs BLn and /BLn (n=1, 2, ...) is selected are input. By means of these signals, the corresponding bit line short signals BRS0n and BRS1n (n=1, 2, ...) are selected and activated. Then, the activated signals are input to the bit line short circuits BS2n (n=1, 2, ...), and during a predetermined time, the corresponding bit lines are fixed to a predetermined voltage VPR by being shorted. On the other hand, a data bus short signal CPR from the data bus short signal circuit DBSS and the bit line short signals BRS0n and BRS1n each are input to the data bus short circuit DBS2. Upon the receipt of these signals, data buses DB and /DB to be connected to the bit lines BLn and /BLn that correspond to each of the bit line short signals BRS0n and BRS1n are selected, and are fixed to a predetermined voltage VPR by being shorted. Further, bit line short signals BRS0n and BRS1n are input to a write amplifier WA2 together with an activation signal WAE. The write amplifier WA2 does not carry out an amplifying operation for the data bus DB or /DB fixed corresponding to each of the bit line short signals BRS0n and BRS1n, and selects and amplifies only the data bus /DB or DB that is not fixed to the predetermined voltage VPR.

By referring to the illustrative view 2 illustrating a principle of operation according to the second embodiment, at the initial stage of data writing, only the data bus DB or /DB that is a data line is amplified, enabling propagation of write data to the bit line BLn or /BLn. Thus, there can be employed a simple control configuration in the prior art in which a pair of column switches TN1 and TN3 or a pair of column switches TN2 and TN4 that is a switch section for connecting the bit line BLn or /BLn with the data bus DB or /DB, and a pair of column switches TN2 and TN4 or a pair of column switches TN1 and TN3 that is complementary switch section for connecting the complementary bit line /BLn or BLn with the complementary data lines /DB or DB are controlled in common. That is, a shield operation during write operation can be achieved without increasing the number of control lines more than necessary, and a write noise shield effect can be achieved efficiently by utilizing the layout properties of the prior art intact.

In the illustrative view 2 for a principle, there is shown a configuration in which either of the bit line short signals BRS0n and BRS1n (n=1, 2, ...) is selected and activated, the activated signal is input to a bit line short circuits BS2n (n=1, 2, ...), and during a predetermined time, the corresponding bit lines are fixed to a predetermined voltage VPR by being shorted. Instead of this operation, the corresponding bit lines may be set so as not to be biased to a predetermined voltage during a predetermined time. A data bus short circuit DBS2 selects data bus DB or /DB, and fixes it to a predetermined voltage VPR. As a result, the corresponding bit lines are fixed to a predetermined voltage VPR by being shorted.

Figure 8:
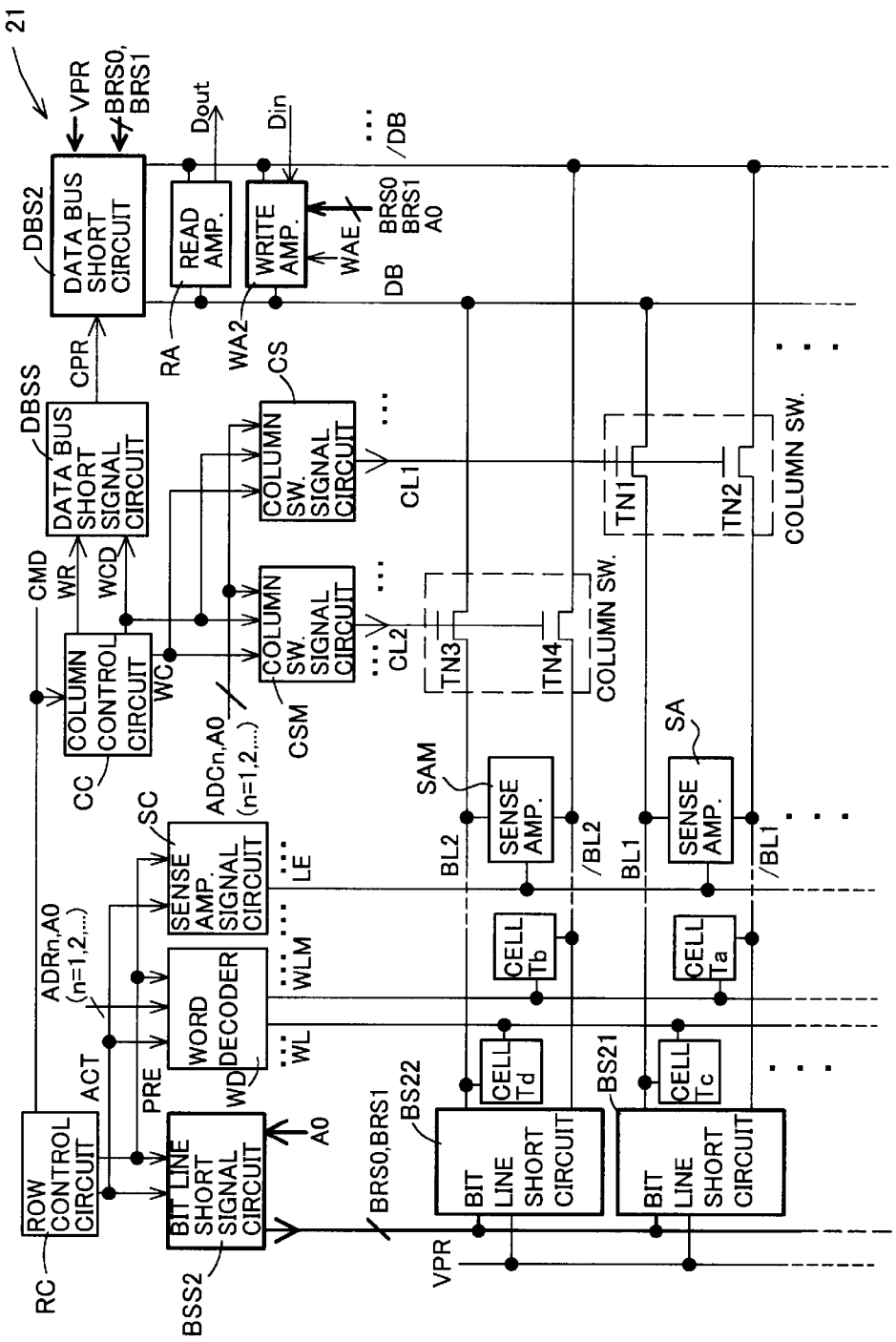
FIG. 8 is a circuit block diagram depicting a memory cell section in a specific example of the second embodiment.
Figure 9:
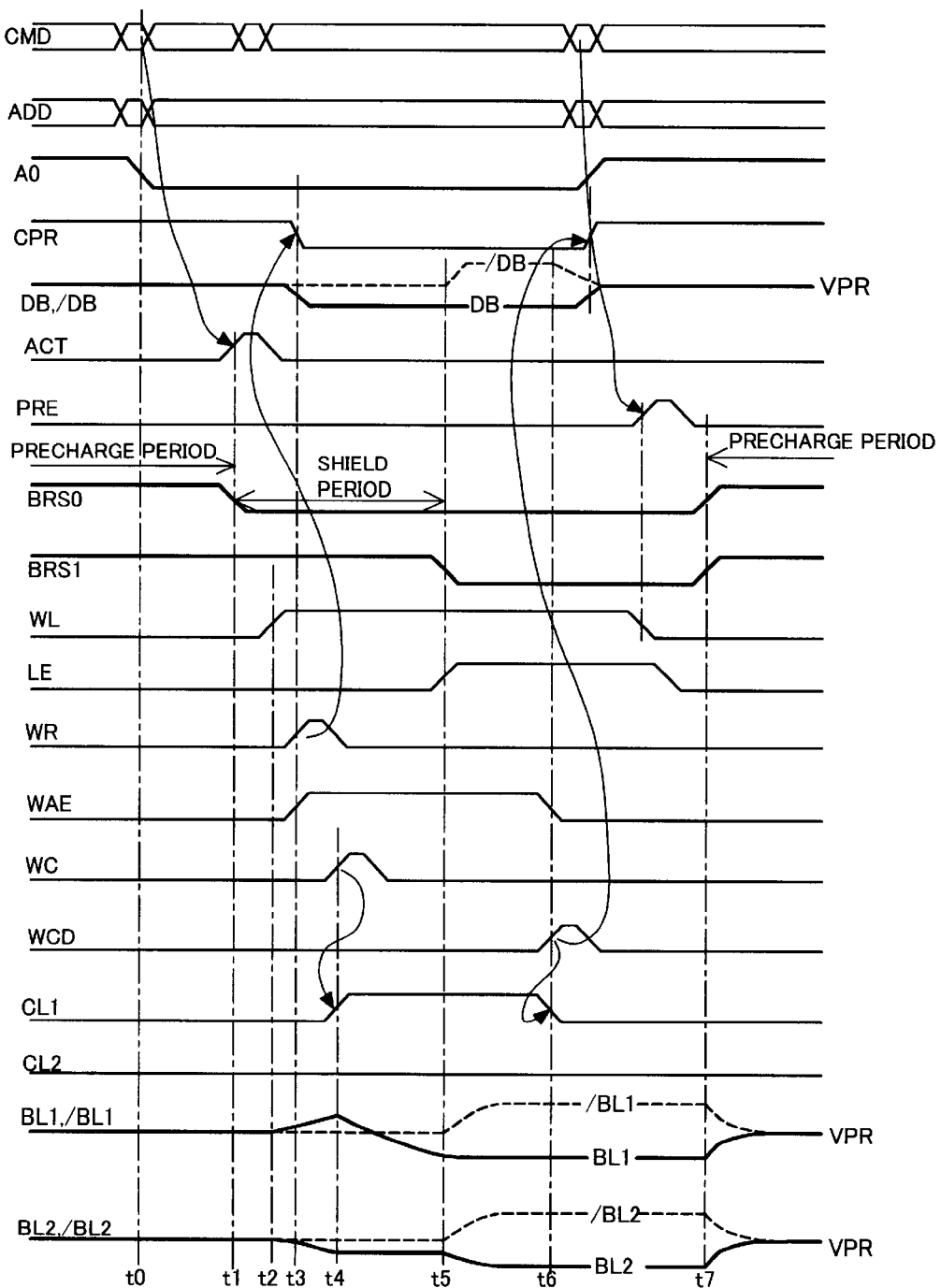
FIG. 9 is a time chart showing a write operation in a specific example of the second embodiment.

A memory cell section 21 in a specific example of the second embodiment shown in FIG. 8 comprises a bit line short signal circuit BSS2, bit line short circuits BS21 and BS22, a data bus short circuit DBS2, and a write amplifier WA2 instead of the bit line short signal circuit BSS, the bit line short circuits BS and BSM, the data bus short circuit DBS, and the write amplifier WA of the memory cell section 1000 of the prior art shown in FIG. 20. An address signal A0 as well as input signals in the prior art is further input to the bit line short signal circuit BSS2. As in the bit line short signal circuit BSS1 in a specific example of the first embodiment, if the address signal A0 is set to a logical level "low", the memory cells Tc and Td connected to the bit lines BL1 and BL2 are selected, and the corresponding bit line short signal BRS0 is selectively output. At the memory cell section 21, the column address signals ADCn as shown in the illustrative view 2 for a principle shown in FIG. 7 are not input to the bit line short signal circuit BSS2, and control for changing the adjacent bit lines to be fixed to a predetermined voltage VPR corresponding to a write bit line is not performed. Of a set of bit line pair BL1 and /BL1, or of bit line pair BL2 and /BL2, a bit line side for which a write operation is not carried out is selected as a complementary bit lines altogether, and the selected bit lines are fixed to a precharge voltage VPR, thereby shielding a write noise. The bit line short circuits BS21 and BS22 are circuits for fixing bit lines BL1 and BL2 or bit lines /BL1 and /BL2 to a precharge voltage VPR corresponding to the bit line short signals BRS0 and BRS1 and precharging it.

Bit line short signals BRS0 and BRS1 as well as input signals in the prior art are further input to a data bus short circuit DBS2. In addition, a bit line precharge voltage VPR is input as a precharge voltage of the data buses DB and /DB. When the data buses DB and /DB are connected to bit lines BL1 and BL2 or bit lines /BL1 and /BL2, they are controlled by means of the bit line short signal BRS0 or BRS1 to be fixed to the same precharge voltage VPR. Bit line short signals BRS0 and BRS1 and the address signal A0 as well as input signals in the prior art are further input to the write amplifier WA2. After the data buses DB and /DB have been connected to bit lines BL1 and BL2 or bit lines /BL1 and /BL2, data is written by means of the write amplifier WA2. However, at the initial stage of data writing, the complementary bit line that is not connected to a memory cell is required to be fixed to the precharge voltage VPR for the purpose of shielding a write noise. Therefore, the write amplifier WA2 is controlled by means of the bit line short signals BRS0 and BRS1 and the address signal A0, and data is written only into a bit line to which a memory cell is connected. With respect to an input signal for the data bus short circuit DBS2 and the write amplifier WA2, instead of the bit line short signals BRS0 and BRS1, if the address signal A0 is defined as an input signal, and a signal having the same phase as the bit line short signals BRS0 and BRS1 is generated, there can be provided operation or advantageous effect similar to the above description.

Hereinafter, a specific circuit example of individual circuit blocks will be described. The bit line short signal circuit BSS2 has the same configuration as the bit line short signal circuit BSS1 in the first embodiment, and provides the same operation or advantageous effect. A duplicate description is omitted here.

Figure 10:
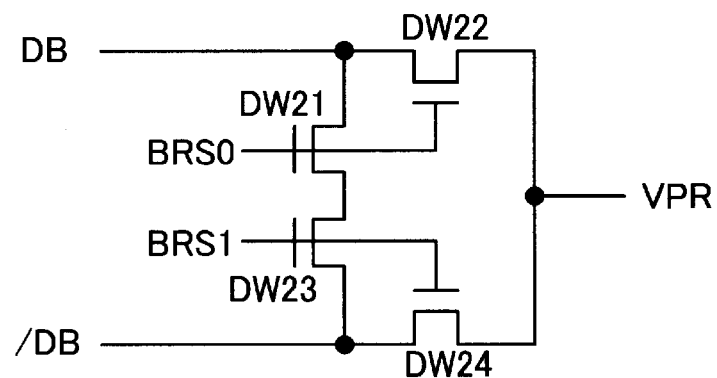
FIG. 10 is a circuit diagram depicting a data bus short circuit in a specific example of the second embodiment.

FIG. 10 is a circuit example of the data bus short circuit DBS2. This circuit has a circuit configuration similar to that of the bit line short circuits BS11 and BS12 (refer to FIG. 4) in a specific example of the first embodiment, and provides the similar operation or advantageous effect. If the bit line short signals BRS0 and BRS1 are activated altogether, data buses DB and /DB are shorted, and the data buses DB and /DB are fixed to a precharge voltage VPR and are set to a precharge state. When either one of the bit line short signals BRS0 and BRS1 is activated, the data buses DB and /DB are not shorted, and are kept to be released. In this state, either one of the data buses DB and /DB can be fixed to the precharge voltage VPR. Further, if the bit line short signals BRS0 and BRS1 are deactivated altogether, all the NMOS transistors DW21 to DW24 are made nonconductive, and are set to a normal readout/write state.

Figure 11:
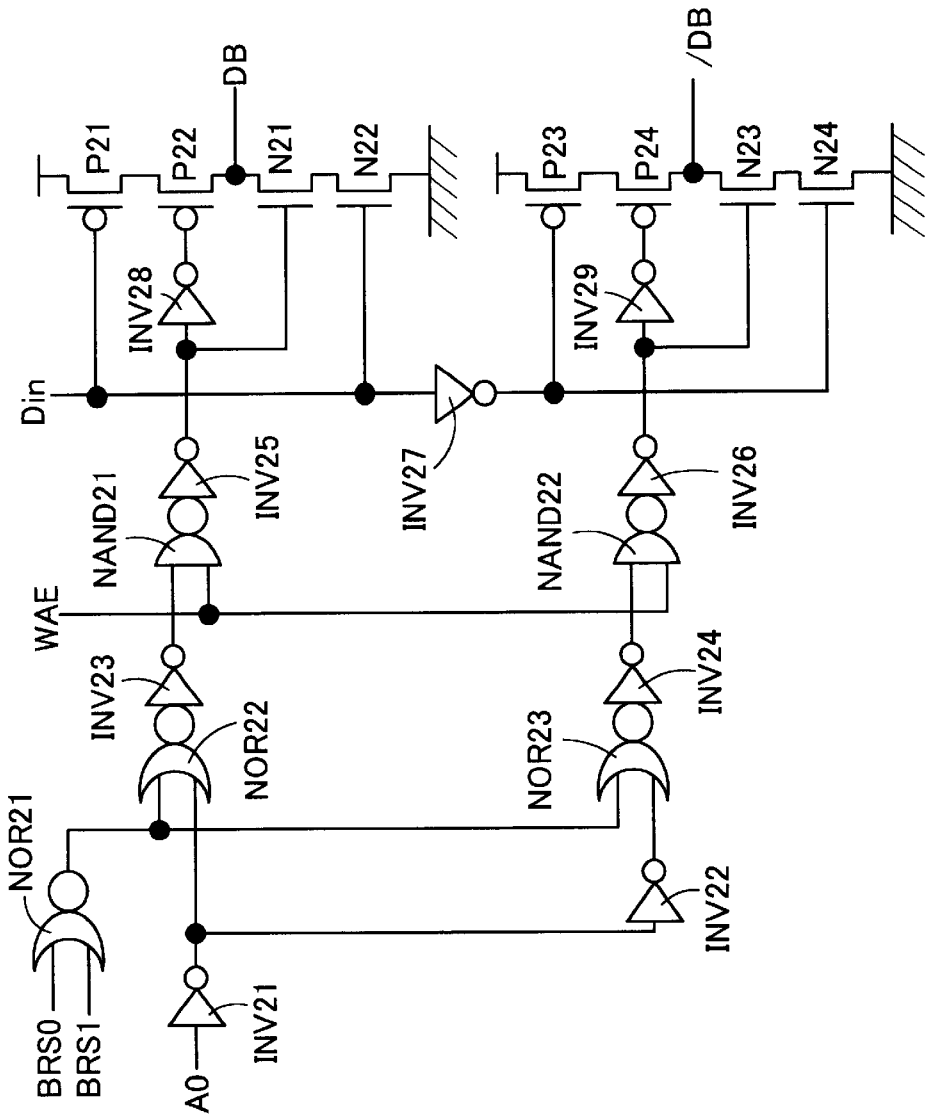
FIG. 11 is a circuit diagram depicting a write amplifier in a specific example of the second embodiment.

FIG. 11 is a circuit example of a write amplifier WA2. Data bus DB is driven by means of a tri-state buffer that controls an output state by means of a PMOS transistor P21 and an NMOS transistor N22 that function as inverting buffers for input data Din and means of a PMOS transistor P22 and an NMOS transistor N21 connected in series to each of the buffer configured transistors. Similarly, data bus /DB is driven by means of a tri-state buffer for controlling an output state by means of inverting buffers P23 and N24 having input thereto an inversion signal of data Din inverted by means of an inverter INV27 and P24 and N23 connected in series.

The control signals of each of the tri-state buffer driving data buses DB and /DB are obtained as an output signal via a inverter INV25 from a NAND gate NAND21 that configures a logical product between an activation signal WAE and each of an output signal of the inverter signal INV23 and an output signal of the inverter INV 24 and an output signal via an inverter INV26 from the NAND gate NAND22. These control signals are supplied after inverted by means of inverters INV28 and INV29, and an output state is controlled when PMOS transistor P22 and P24 are driven.

The NOR gate NOR22 with the inverter 23 and the NOR gate NOR23 with the inverter 24 configure logical summation. Each logical summation is computed between an output signal from the NOR gate NOR 21 of the bit line short signals BRS0 and BRS1 and an inversion signal via the inversion INV 21 of the address signal A0, and further, a re-inversion signal caused by the inverter INV 22.

In the write amplifier WA2, in the case where either of the bit line short signals BRS0 and BRS1 is activated, an output signal of the NOR gate NOR 21 is set to a logical level "low". Thus, a logical summation computation output at the next stage is controlled by means of the address signal A0. That is, in the case where the address signal A0 is set to its logical level "low", a logical summation computation output having input thereto the inverting signal caused by the inverter INV21 is set to its logical level "high". Then, logical summation computation output having input thereto re-inversion signal by means of the inverter INV22 is set to its logical level "low". By means of the activation signal WAE, the tri-state buffer at the data bus DB is set to an output enable state, the data Din is amplified and output. In contrast, the tri-state buffer at the data bus /DB is set to an output high impedance state, and the data bus /DB is not amplified. In the case where address signal A0 is set to its logical level "high", logic is inverted and data bus /DB is amplified and data bus DB is not amplified. Therefore, in the case where the address signal A0 is set to its logical level "low", and the memory cells Tc and Td are connected to the bit lines BL1 and BL2, the data bus DB is amplified, and write operation is carried out for either of the bit lines BL1 and BL2. At the same time, where the data bus /DB connected to the complementary bit lines /BL1 and /BL2 is not driven, the data bus short circuit DBS2 fixes the complementary bit lines /BL1 and /BL2 to the precharge voltage VPR. In the case where the address signal A0 is set to its logical level "high", and the memory cells Ta and Tb are connected to the bit lines /BL1 and /BL2, the data bus /DB is amplified, and write operation is carried out for either of the bit lines /BL1 and /BL2. At the same time, where the data bus DB connected to the complementary bit lines BL1 and BL2 is driven, the data bus short circuit DBS2 fixes the complementary bit line BL1 and BL2 to the precharge voltage VPR.

The complementary bit lines /BL1 and /BL2 or the bit lines BL1 and BL2 are controlled by means of bit line short signals BRS1 and BRS0, and are fixed to the precharge voltage VPR by means of bit line short circuits BS21 and BS22. Therefore, in the write amplifier WA2, if driving of the data bus /DB or DB connected to the complementary bit lines /BL1 and /BL2 or the bit lines BL1 and BL2 is stopped, there is no need to make a fixing operation for the precharge voltage VPR by means of the data bus short circuit DBS2.

In a timing chart of write operation in a specific example of the first embodiment shown in FIG. 3, the data bus DB or /DB is precharged to a high level, and one of them is reduced to a low level during amplification. In contrast, in a timing chart of write operation shown in FIG. 9, the data bus DB or /DB is precharged to the voltage level of the precharge voltage VPR. In a shield period of a write noise at the initial write stage for the bit line BL1, only the data bus DB is first amplified (in the case of FIG. 9, the data bus is amplified to a low level). After a potential difference between all of a bit line pair BL1 and /BL1 and a bit line pair BL2 and /BL2 including write bit line pair BL1 and /BL1 has reaches the amplification sensitivity of the sense amplifiers SA and SAM (time t5), the sense amplifier SA and SAM are activated by means of an activation signal LE. The other operation is similar to the first embodiment (refer to FIG. 3) or prior art (refer to FIG. 21). A duplicate description is omitted here.

As has been described above, in a specific example 21 of the second embodiment, at the initial stage of data writing, only the data line DB is amplified, making it possible to propagate write data for the bit line BL1. Thus, there can be employed a simple control configuration in the prior art in which a column switch TN1 that is a switch section for connecting the bit line BL1 with the data line DB and a column switch TN2 that is a complementary switch section for connecting the complementary bit line /BL1 with the complementary data line /DB are controlled in common. A write noise shielding operation can be achieved without increasing the number of control number more than necessary. In addition, a write noise shielding effect can be achieved efficiently by utilizing the layout properties of the prior art intact.

Further, prior to amplifying data to be written by pairing data buses DB with /DB, the complementary data line /DB can be driven by means of a precharge voltage VPR that is a predetermined voltage at a timing set by a timing setting section t11 in the bit line short signal circuit BSS 2. In this manner, the bit line /BL1 that is a complementary bit line can be fixed to a precharge voltage VPR for the purpose of shielding while there is employed a simple control configuration in the prior art in which the column switches TN1 and TN2 are controlled in common.

In this case, there is also provided a fixing operation for the precharge voltage VPR by means of bit line short circuits BS21 and BS22. Thus, even if a configuration is provided so as to drive the data buses DB and /DB by means of tri-state buffers in the write amplifier WA2 without making a voltage fixing operation for the precharge voltage VPR in the data bus short circuit DBS2 and so as to stop driving of the data bus /DB, the similar advantageous effect can be achieved.

In addition, the bit lines BL1 and BL2 connected to the selected memory cells Tc and Td and the complementary bit lines /BL1 and /BL2 corresponding to nonselective memory cells Ta and Tb can be fixed independently to the precharge voltage VPR that is a predetermined voltage. Moreover, the complementary bit lines /BL1 and /BL2 to be fixed can be selected in batch without a need to select these bit lines corresponding to the write bit line BL1. Thus, during write operation, all the complementary bit lines /BL1 and /BL2 are selected altogether, and are simply and reliably fixed to the precharge voltage VPR, whereby a write noise can be shielded. Further, a timing for fixing to the precharge voltage VPR can be set. Thus, the complementary bit lines /BL1 and /BL2 can be fixed to the precharge voltage VPR according to a period affected by a write noise, whereby a write noise can be properly shielded.

In particular, in the case where the bit lines BL1 and BL2 connected to selected memory cells Tc and Td and the complementary bit lines /BL1 and /BL2 corresponding to nonselective memory cells Ta and Tb are laid out alternately, a voltage transition in a bit line BL1 for which a write operation is carried out is simply and reliably shielded, and the voltage reversal of the adjacent bit lines /BL1, BL2, and /BL2 caused by a write noise can be prevented.

In a specific example 21 of the second embodiment, there is shown a configuration in which either of the bit line short signals BRS0 and BRS1 is selected and activated, and is input to a bit line short circuit BS21, whereby the corresponding complementary bit line /BL1 is fixed to a predetermined voltage VPR after being shorted during a predetermined time. However, instead of this operation, the corresponding complementary bit line /BL1 may be set so as not to be biased to a predetermined voltage during a predetermined time. The data bus short circuit DBS2 selects a data bus /DB, and is fixed to a predetermined voltage VPR after being shorted. As a result, the corresponding complementary bit line /BL1 is fixed to a predetermined voltage VPR after being shorted.

Figure 12:
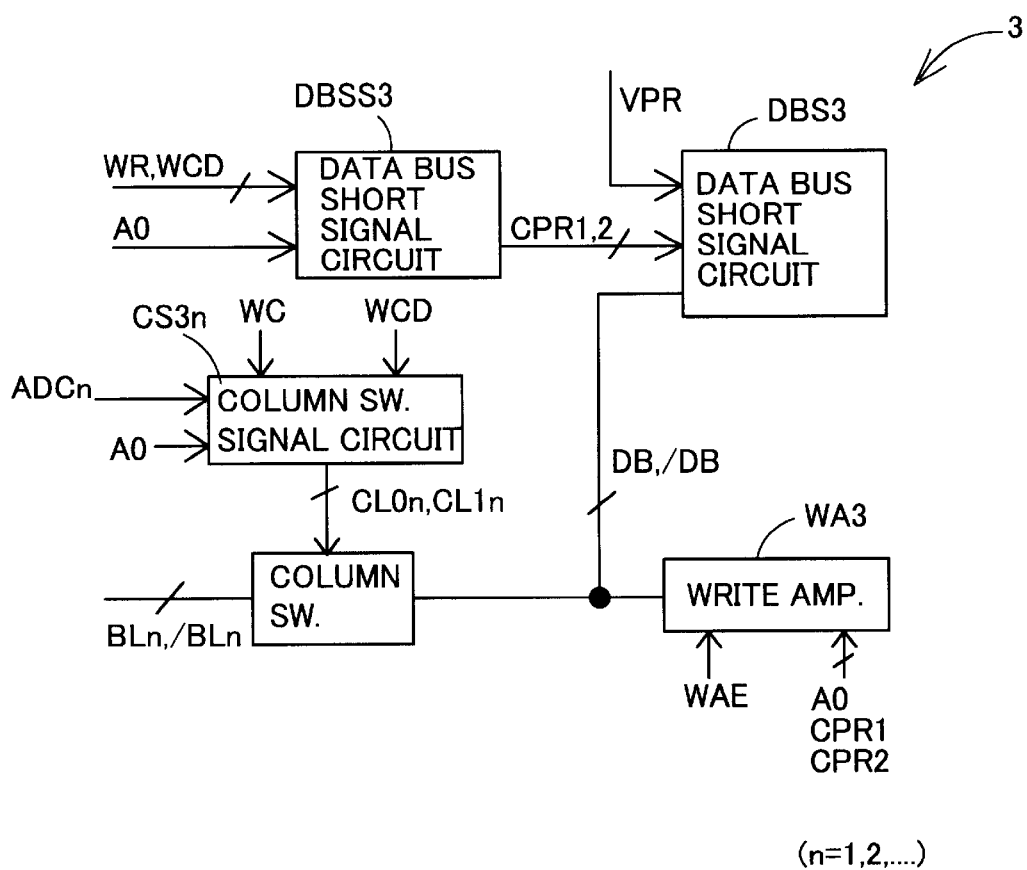
FIG. 12 is a view illustrating a principle according to a third embodiment of the present invention.

In the illustrative view 3 illustrating a principle of operation according to a third embodiment shown in FIG. 12, an address signal A0 for determining which of a bit line pair other than control signals WR and WCD is selected is input to a data bus short signal circuit DBSS3. Upon the receipt of these signals, a data bus short signal DBSS is activated by selecting data bus short signals CPR1 and CPR2, and the activated signal is input to a data bus short circuit DBS3, and the corresponding data bus DB or /DB is fixed to a predetermined voltage VPR during a predetermined time after being shorted.

On the other hand, in a column switch signal circuits CS3n (n=1, 2, . . . ), as in the column switch signal circuits CS1n (n=1, 2, . . . ) according to the first embodiment, the column address signals ADCn (n=1, 2, . . . ) and an address signal A0 are input, the input signals are controlled by means of the control signals WC and WCD, and the column switch signals CL0n and CL1n (n=1, 2, . . . ) are output. However, in the third embodiment, unlike the first embodiment, the corresponding data bus DB or /DB is connected to a bit line for which write operation is carried out, of the selected bit lines BLn or /BLn (n=1, 2, . . . ), by means of these column switch signals CL0n and CL1n. In addition, all the other complementary bit line /BLn or BLn is activated so as to be connected to the data bus /DB or DB.

Further, apart from the activation signal WAE, the data bus short signals CPR1 and CPR2 and the address signal A0 are input to the write amplifier WA3. Upon the receipt of these signals, the write amplifier WA3 amplifies data relevant to the data bus DB or /DB connected to the bit line BLn or /BLn for which write operation is carried out. This amplifier does not carries out an amplification operation for the data bus /DB or DB connected to the bit line /BLn or BLn for which write operation is not carried out.

Referring to the illustrative view 3 illustrating a principle of operation according to the third embodiment, a bit line /BLn or BLn that is a complementary bit line is fixed to a precharge voltage VPR from the data bus /DB or DB that is a complementary data line fixed to a precharge voltage VPR that is a predetermined voltage via a column switch that is a conductive complementary switch section. Thus, complementary bit lines containing predetermined complementary bit lines /BLn or BLn can be fixed to a precharge voltage VPR without providing individual clamp portions that can be driven independently by properly dividing the bit lines and complementary bit lines.

Figure 13:
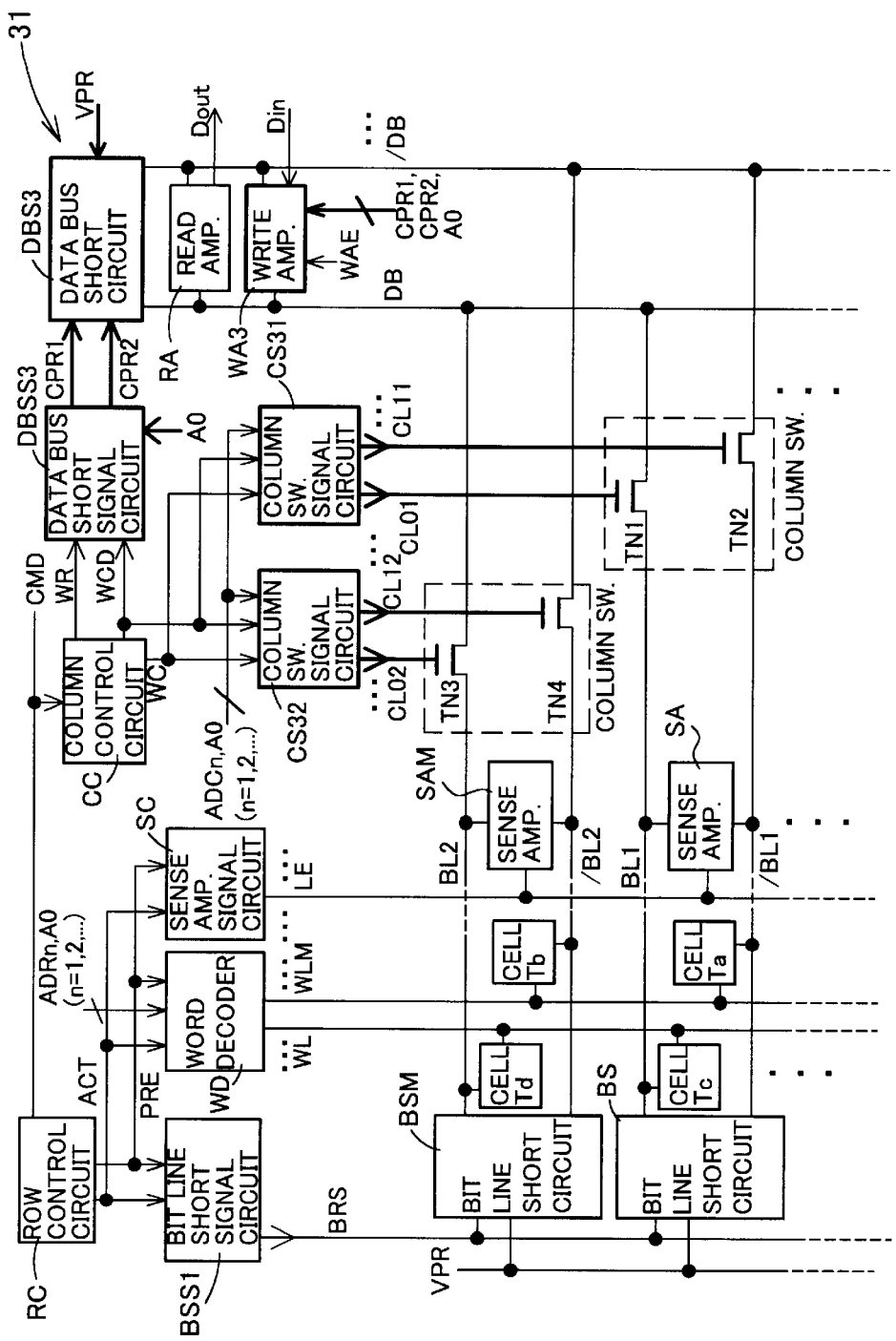
FIG. 13 is a circuit block diagram depicting a memory cell section in a specific example of the third embodiment.

A memory cell section 31 in a specific example of the third embodiment shown in FIG. 13 comprises: column switch signal circuits CS31 and CS32; a data bus short signal circuit DBSS3, a data bus short circuit DBS3; and a write amplifier WA3 instead of the column switch signal circuit CS, CSM, data bus short signal circuit DBSS, data bus short circuit DBS, and write amplifier WA of a memory cell section 1000 according to the prior art shown in FIG. 20.

An address signal A0 is input to the column switch signal circuits CS31 and CS32 as in the column switch signal circuits CS11 and CS12 according to the first embodiment. By means of the column address signals ADCn and an address signal A0, in order to connect to the data bus DB or /DB a bit line BL1, /BL1, BL2, or /BL2 for which write operation should be carried out, of bit line pair BL1 and /BL1 and bit line pair BL2 and /BL2, and all the complementary bit lines each having a complementary relation with a selected bit line, to be fixed to the precharge voltage VPR, the column switch signal circuits CS31 and CS32 activates column switch signals CL01, CL11, CL02, or CL12 for making the corresponding column switches TN1 to TN4 conductive.

An address signal A0 as well as input signals in the prior art are further input to the data bus short signal circuit DBSS3. The data bus short signal circuit DBSS3 releases data bus DB or /DB connected to the bit lines BL1, BL2 or /BL1, /BL2, respectively, from the precharge voltage VPR. The bit lines BL1, BL2", /BL1, and /BL2 correspond to the address signal A0. Furthermore, for data bus /DB or DB connected to the complementary bit lines /BL1, /BL2 or BL1, BL2, respectively, the data bus short signal circuit DBSS3 outputs the data bus short signals CPR1 and CPR2 for continuously fixing to the precharge voltage VPR to the data bus short circuit DBS3. The complementary bit lines /BL1, /BL2, BL1, and BL2 have complementary relation with bit lines /BL1, /BL2, BL1, and BL2, respectively. The precharge voltage VPR of the data buses DB and /DB as well as input signals in the prior art is further input to the data bus short circuit DBS3. Then, control for fixing the data bus DB or /DB to the precharge voltage VPR according to the data bus short signals CPR1 and CPR2 is carried out.

Data bus short signals CPR1 and CPR2 and an address signal A0 as well as input signals in the prior art are further input to a write amplifier WA3. Data bus DB or /DB is connected to bit lines BL1, BL2, /BL1, or /BL2 and the like for which write operation is carried out, data is amplified by means of a write amplifier WA3, and write operation is carried out. Here, at the initial state of data writing, the complementary bit lines /BL1 and /BL2 or bit lines BL1 and BL2 that are not connected to a memory cell are required to be fixed to the precharge voltage VPR for the purpose of shielding a write noise. The data bus /DB or DB for which write operation is not carried out is connected by selecting the complementary bit lines /BL1 and /BL2 or bit lines BL1 and BL2 for which a memory cell is not connected altogether. In addition, a write amplifier WA3 is controlled by means of the data bus short signals CPR1 and CPR2 and the address signal A0, and the precharge voltage VPR is supplied. With respect to an input signal for the data bus short circuit DBS3 and the write amplifier WA3, even if the address signal A0 is defined as an input signal instead of the data bus short signals CPR1 and CPR2, operation and advantageous effect similar to the above description can be achieved.

Figure 15:
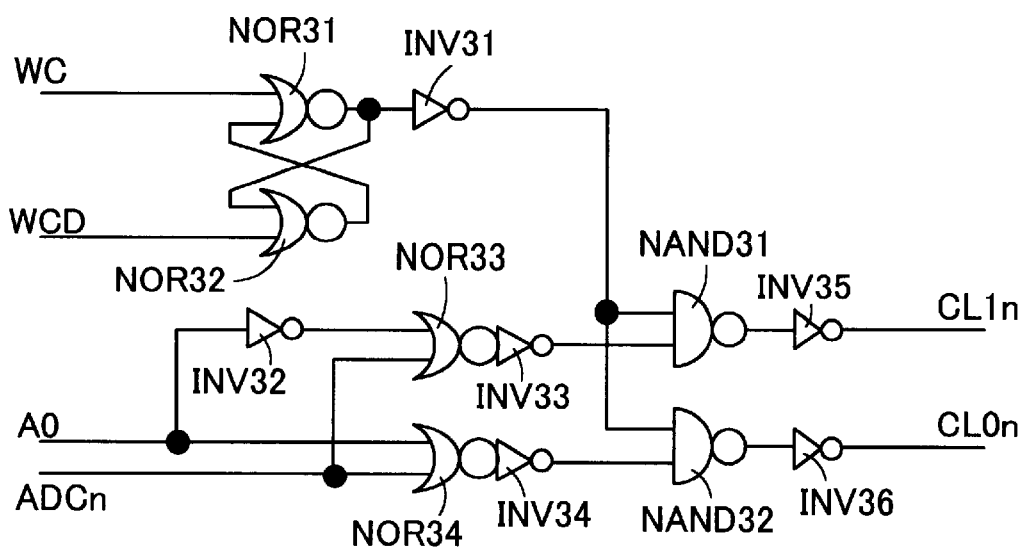
FIG. 15 is a circuit diagram depicting a column switch signal circuit in a specific example of the third embodiment.

Hereinafter, a specific circuit example of individual circuit blocks will be described. FIG. 15 is a circuit example of the column switch signal circuits CS31 and CS32. As in the column switch signal circuits CS11 and CS12 (refer to FIG. 6) according to the first embodiment, the column switch signal circuits CS31 and CS32 generates column switch signals CL0n and CL1n as output signals of logical products each composed of the NAND gate NAND32 and inverter INV36 and the NAND gate NAND31 and inverter INV35. As an input signal for these logical products, an output signal of a fourth input latch circuit composed of the cross coupled NOR gates NOR 31 and NOR 32 and the inverter INV31, a control signal WC being defined as a set signal, and a control signal WCD being defined as a reset signal, is connected in common to a NAND gate NAND32 and a NAND gate NAND31. Further, column address signals ADCn and an address signal A0 are logically summed and input to the NAND gate NAND 32 via the NOR gate NOR34 and the inverter INV 34. Column address signals ADCn and the address signal A0 inverted by the inverter INV32 are logically summed and input to the NAND gate NAND31 via the NOR gate NOR33 and the inverter INV33. A configuration of a fourth input latch circuit is similar to that of an input latch circuit according to first to third embodiments.

The column switch signal circuits CS31 and CS32 are provided every column address signals ADCn. Upon the receipt of a control signal WC of a positive pulse from the column control circuit CC, the fourth input latch circuit is set. Then, the column switch signal circuits CS31 and CS32 activates the column switch signals CL0n and CL1n that correspond to the selected column address signals ADCn, connect bit line pair BL1 and /BL1 or bit line pair BL2 and /BL2 for which write operation is carried out with data bus DB and /DB. Further, in the case where the address signal A0 is set to a logical level "low" relevant to a bit line that corresponds to a nonselective column address signals ADCn, the column switch signals CL1n are activated, and the bit lines /BL1 and /BL2 and the data bus /DB are connected with each other. When the address signal A0 is set to a logical level "high", column switch signals CL0n are activated and bit lines BL1, BL2 are connected to data bus DB. When the address signal A0 is set to a logical level "low", the bit lines BL1 and BL2 are connected to a memory cell, and when the address signal A0 is set to a logical level "high", bit lines /BL1, /BL2 are connected to a memory cell, and thus, the complementary bit line not to be connected to a memory cell are connected with the data bus.

Figure 16:
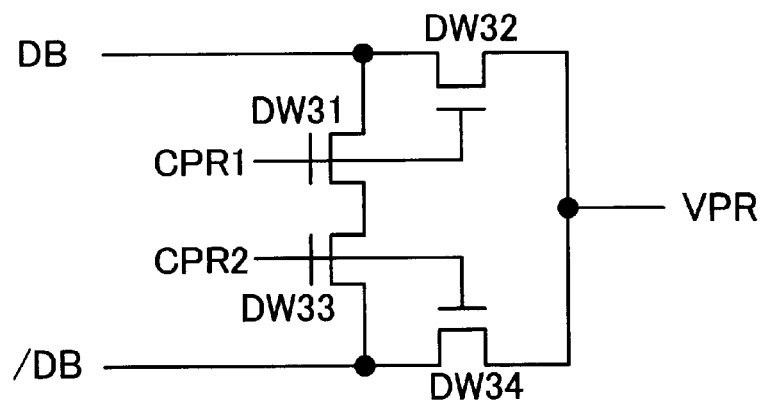
FIG. 16 is a circuit diagram depicting a data bus short circuit in a specific example of the third embodiment.

FIG. 16 is a circuit example of a data bus short circuit DBS3. Except that the data bus short signals CPR1 and CPR2 are connected instead of the bit line short signals BRS0 and BRS1 in the data bus short circuit DBS2 (refer to FIG. 10) according to the second embodiment, the construction is similar to that of the data bus short circuit DBS2 according to second embodiment, the similar operation and advantageous effect are provided. A description of such similar operation and advantageous effect is omitted here.

FIG. 17 is a circuit example of a data bus short signal circuit DBSS3. This circuit has a circuit configuration similar to the bit line short signal circuit BSS1 (refer to FIG. 5) according to the first embodiment. A control signal WR from the column control circuit CC is input instead of the active signal ACT in the bit line short signal circuit BSS1. A control signal WCD from the column control circuit CC is input instead of the precharge signal PRE. As an output signal, the data bus short signals CPR1 and CPR2 are output instead of the bit line short signals BRS0 and BRS1.

When the control signal WR is input, a fifth input latch circuit composed of NOR gates NOR36 and NOR37 and inverter INV37 is first set. If the address signal A0 is set to its logical level "low", an output signal of the NAND gate NAND36 is status changed to its logical level "low". The data bus short signal CPR1 is status changed to its logical level "low", and is inactivated. When the address signal A0 is set to its logical level "high", an output signal of the NAND gate NAND33 is status changed to its logical level "low". In addition, the data bus short signal CPR2 as well is status changed to its logical level "low", and is inactivated. That is, a control signal WR is input to enter an access state, and a precharge operation for a selective bit line selected by the address signal A0 is released. Further, after an elapse of a delay time caused by a timing setting section t31, a sixth input latch circuit composed of the NOR gates NOR38 and NOR39 and inverter INV38 is set, and an output signal is inverted into its logical level "high". Upon the receipt of this, if the address signal A0 is set to its logical level "low", an output signal of the NAND gate NAND34 is status changed to its logical level "low". Then, the data bus short signal CPR2 is status changed to its logical level "low", and is inactivated. When the address signal A0 is set to its logical level "high", an output signal of the NAND gate NAND35 is status changed to its logical level "low". Then, the data bus short signal CPR1 is status changed to its logical level "low", and is inactivated. If a delay time caused by the timing setting section t31 is set to a noise shield period caused by a write operation, a data bus on a bit line that is not connected to a memory cell can be set to a precharge voltage VPR during a delay time caused by the timing setting section t31.

FIG. 18 is a circuit example of a write amplifier WA3. A basic circuit configuration is similar to that of a write amplifier WA2 according to the second embodiment (refer to FIG. 11). The write amplifier WA3 comprises inverters INV3E and INV3F instead of a NOR gate NOR21 in the write amplifier WA2. The data bus short signal CPR1 is input to the inverter INV3E, and the data bus short signal CPR2 is input to the inverter INV3F. The respective output signals are input to the NOR gates NOR3A and NOR3B each as in the NOR gate NOR21 in the write amplifier WA2. The other configuration is similar to that of the write amplifier WA2 according to the second embodiment. A duplicate description is omitted here.

In the case where data bus short signals CPR1 and CPR2 are activated, the write amplifier WA3 is controlled by means of the address signal A0. That is, in the case where the address signal A0 is set to its logical level "low", a tri-state buffer at the data bus DB is set to an output enable state by means of an activation signal WAE, and the data Din is amplified and output. In contrast, the tri-state buffer on the data bus /DB is set to an output high impedance state, and data bus /DB is not amplified. In the case where the address signal A0 is set to its logical level "high", the logic is inverted. Thus, the data bus /DB is amplified, and the data bus DB is not amplified. Therefore, in the case where the address signal A0 is set to its logical level "low", and the bit lines BL1 and BL2 are selected, the data bus DB is amplified, and write operation is carried out for either of the bit lines BL1 and BL2. At the same time, where the data bus /DB connected to the complementary bit lines /BL1 and /BL2 is not driven, the data bus short circuit DBS3 fixes the complementary bit lines /BL1 and /BL2 to the precharge voltage VPR. In the case where the address signal A0 is set to its logical level "high", and the bit lines /BL1 and /BL2 are selected, the data bus /DB is amplified, and write operation is carried out for either of the bit lines /BL1 and /BL2. At the same time, where data bus DB connected to the complementary bit lines BL1, and BL2 is not driven, data bus short circuit DBS3 fixes the complementary bit lines BL1, and BL2 to the precharge voltage VPR.

Figure 14:
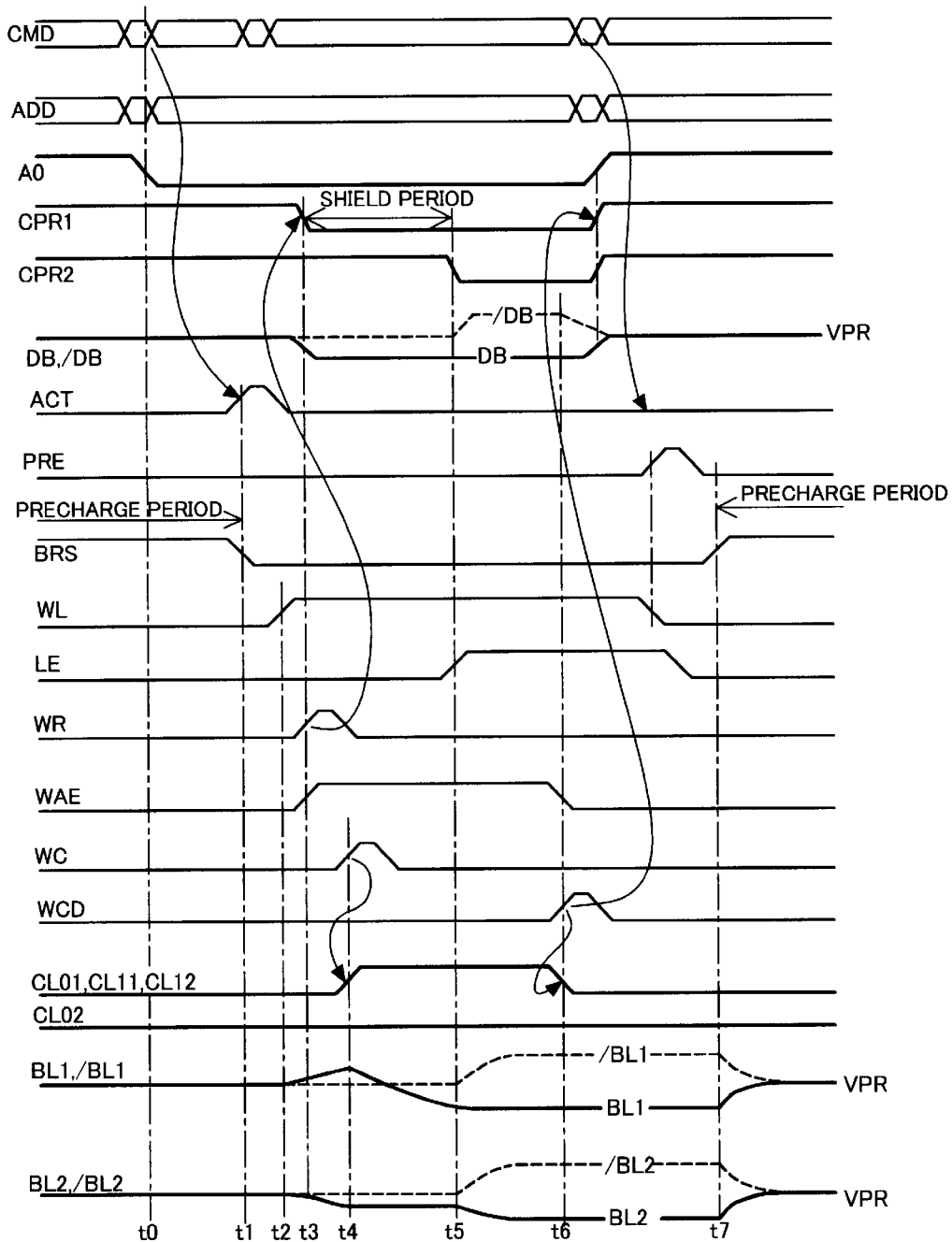
FIG. 14 is a time chart showing a write operation in a specific example of the third embodiment.
Figure 21:
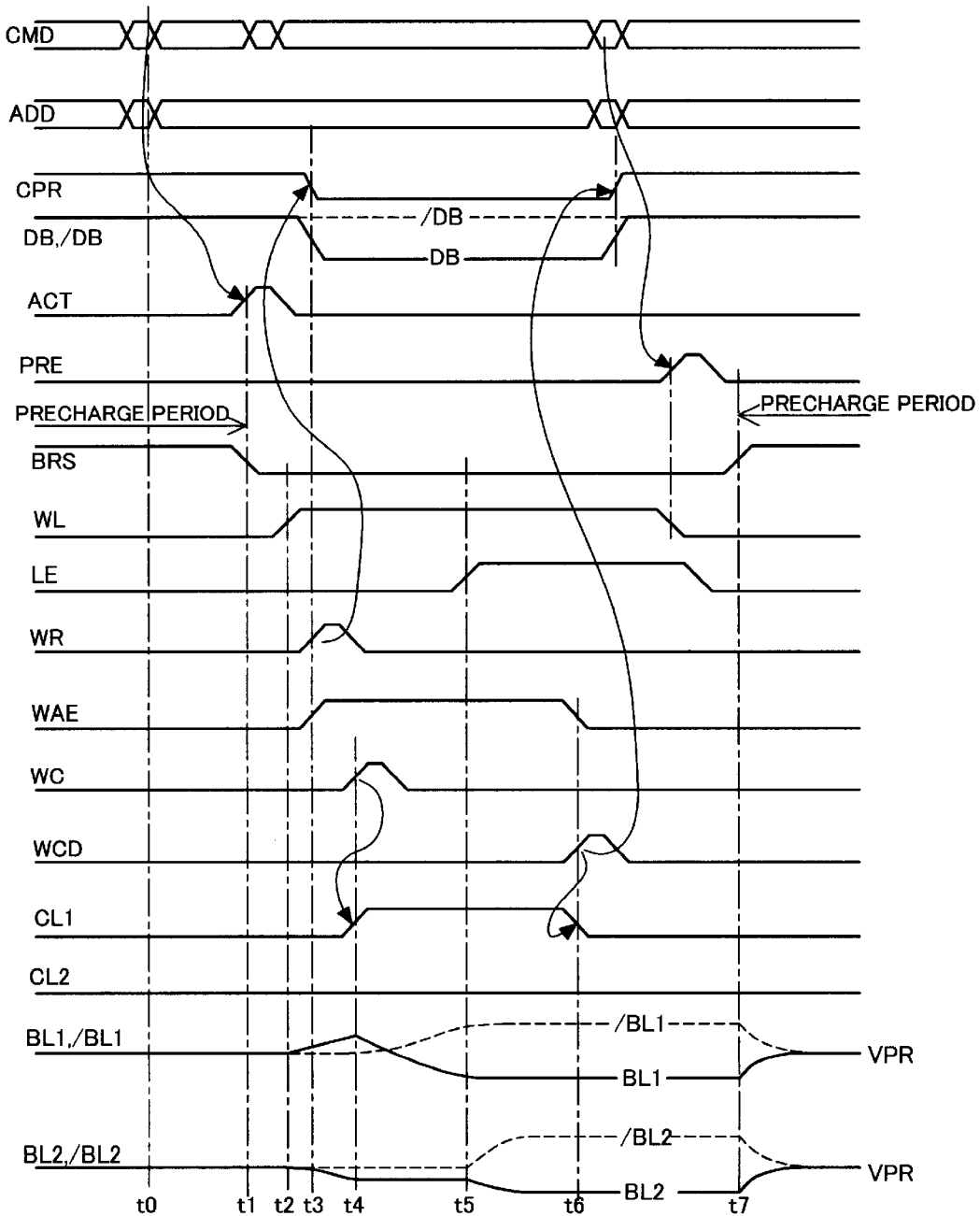
FIG. 21 is a time chart showing a write operation for a conventional memory cell section.
Figure 22:
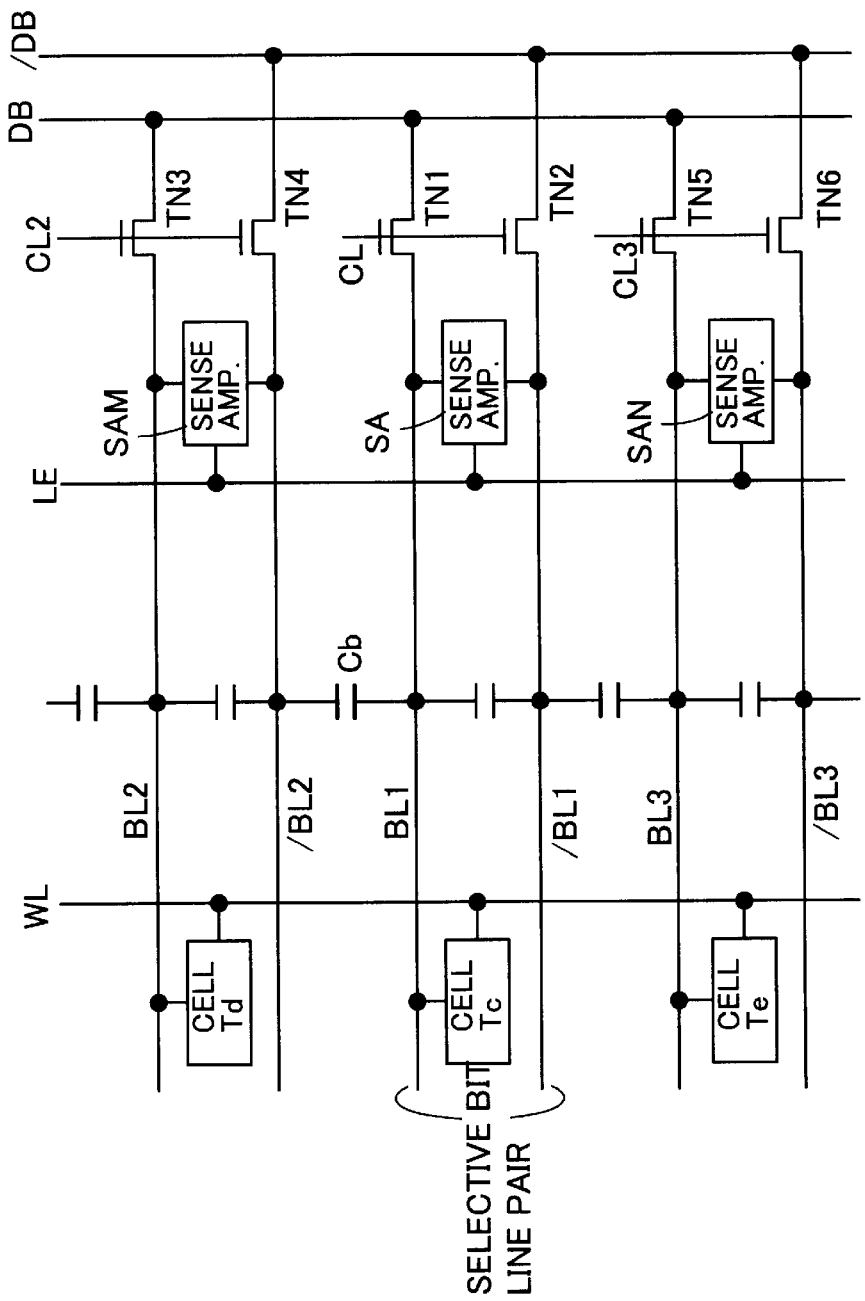
FIG. 22 is an illustrative view illustrating a parasitic capacity between bit lines of the memory cell section.

Instead of the timing chart of the write operation of the prior art shown in FIG. 21, in a timing chart of a write operation shown in FIG. 14, after an elapse of a precharge period caused by an active signal ACT as well, the data bus short signal CPR2 maintains its logical level "high" during a predetermined period. Then, the data bus /DB is fixed to the precharge voltage VPR, whereby the complementary bit lines /BL1 and /BL2 that are nonselective bit lines to which a memory cell are not connected are fixed to the precharge voltage VPR, and a write noise is shielded. This time is defined as a shield period. In the shield period, the selected word line WL is activated, and the stored charge is redistributed from the memory cells Tc and Td selected for the bit lines BL1 and BL2. At the same time, the data bus short signal CPR1 is released by means of the control signal WR of the positive pulse. Then, the write amplifier WA3 is activated by means of the activation signal WAE, and write data is amplified for only the data bus DB (in the case of FIG. 14, data "0" is amplified). Then, the amplified data is activated by means of the control signal WC of the positive pulse, and the column switch signals CL01, CL11, and CL12 are activated to make the column switches TN1, TN2, and TN4 conductive. In addition, the bit line BL1 and data bus DB are connected with each other, data is written into the bit line BL1, and the complementary bit lines /BL1 and /BL2 are fixed to the precharge voltage VPR. Where data "1" is stored in the selected memory cell Ta, and the bit line BL1 is shifted to the high level side, the write data is obtained as data "0". The data bus DB is shifted to the low level. Thus, the bit line BL1 is set to the low level side, and write operation is carried out. This write status is maintained until a potential difference caused by writing of bit line pair BL1 and /BL1 for which write operation is carried out has reached the amplification sensitivity of the sense amplifier SA. In this duration, at the same time, the stored charge from the memory cell Td is redistributed in order to carry out refresh operation in another bit line BL2. This redistribution continues until a potential difference between the bit line pair BL2 and /BL2 has reached the amplification sensitivity caused by the sense amplifier SAM. In this state, the bit lines BL2 and /BL2 are in a floating state. Then, the complimentary bit lines /BL1 and /BL2 to which a memory cell is not connected are set to the precharge voltage VPR, whereby the voltage transition caused by the write operation is prevented from propagating the adjacent bit line BL2 or complementary bit lines /BL1 and /BL2 via the parasitic capacity Cb which results in incorrect data inversion. At a time when a potential difference between voltage in all the selective bit lines BL1 and BL2 containing a write bit line BL1 and a precharge voltage VPR that is a fixed voltage of the complementary bit lines /BL1 and /BL2 has reached the amplification sensitivity, the sense amplifier SA and SAM are activated by means of an activation signal LE, and amplification is carried out. The subsequent operation is similar to that according to the prior art (refer to FIG. 21).

As has been described above, in a specific example 31 of the third embodiment, there are fixed a pair of complementary bit lines /BL1 and /BL2 or a pair of bit lines BL1 and BL2 at a precharge voltage VPR from a data bus /DB or DB that is a complementary data line fixed to a precharge voltage VPR that is a predetermined voltage via a pair of column switches TN2 and TN4 or a pair of column switches TN1 and TN3 that are conductive complementary switches. Thus, all the complementary bit lines /BL1 and /BL2 or bit lines BL1 and BL2 containing predetermined complementary bit lines are fixed to the precharge voltage VPR altogether without providing individual clamp sections capable of driving bit lines and complementary bit lines independently to be properly divided.

In addition, the bit lines BL1 and BL2 connected to memory cells Tc and Td that are the selected memory cells and the complimentary bit lines /BL1 and /BL2 that correspond to the memory cells Ta and Tb that are nonselective memory cells can be fixed to the precharge voltage VPR that is a predetermined voltage, independently, and moreover, the complimentary bit lines /BL1 and /BL2 to be fixed can be selected altogether without a need to select them corresponding to the write bit line BL1. Thus, during write operation, all the complementary bit lines /BL1 and /BL2 are selected altogether, and are simply and reliably fixed to the precharge voltage VPR, whereby a write noise can be shielded. Further, a timing for fixing to the precharge voltage VPR can be set. Thus, the complimentary bit lines /BL1 and /BL2 are fixed to the precharge voltage VPR according to a period affected by a write noise, whereby a write noise can be properly shielded.

In particular, in the case where the bit lines BL1 and BL2 connected to the selected memory cells Tc and Td or the like and the complementary bit lines /BL1 and /BL2 corresponding to the nonselective memory cells Ta and Tb are laid out alternately, a voltage transition in bit line BL1 for which write operation is carried out is simply and reliably shielded, whereby the voltage reversal of the adjacent bit lines /BL1, BL2, and /BL2 caused by a write noise can be prevented.

FIG. 19 shows a write operation waveform in the case of a specific example according to the first embodiment. The figure shows that an effect of a write noise is eliminated by using a comparison with the write operation waveform in the case of the prior art in FIG. 23. As in FIG. 23, FIG. 19A shows a time chart of a write operation in a pair of selective bit line BL1 and complementary bit line /BL1 having connected thereto a memory cell Tc into which data is to be written. FIG. 19B shows a time chart for reading out the stored charge from the memory cell Td for the purpose of refresh operation carried out at the same time with the adjacent bit line pair BL2 and /BL2.

When a bit line short signal BRS0 is inactivated, and a word line WL is activated, the stored charge is started to be redistributed from the selected memory cells Tc and Td to each of the bit lines BL1 and BL2. A potential of the bit line BL1 is started to rise according to the stored charge of each of the memory cells Tc and Td, and a potential of the bit line BL2 is started to fall. Next, a switch signal CL01 is activated, and only a column switch TN1 is made conductive. Then, a connection between the data bus line DB amplified at a proper timing with activation of the word line WL and the bit line BL1 is made for the purpose of write operation for the memory cell Tc. Because of writing of data "0", a potential of the bit line BL1 is reversed by means of a write amplifier WA, and is set to its low level side. At this stage, the adjacent bit line BL2 is in way of redistribution of the stored charge from the memory cell Td, and a potential difference between the bit line pair BL2 and /BL2 does not reach the amplification sensitivity of the sense amplifier SAM. Thus, the sense amplifier SAM is in an inactive state. That is, the bit line BL2 is in a floating state. On the other hand, the bit line short signal BRS1 maintains its logical level "high" in this duration, and the complementary bit lines /BL1 and /BL2 that are nonselective bit lines are fixed to the precharge voltage VPR, whereby a write noise is shielded.

The complementary bit line /BL2 is adjacent to the bit line BL1 set to the low level side, and a parasitic capacity Cb exists as a parasitic capacity. However, the adjacent complimentary bit lines /BL1 and /BL2 are fixed to the precharge voltage VPR, and thus, the voltage transition caused by write operation for the bit line BL1 is shielded by means of the adjacent complementary bit lines /BL1 and /BL2. The complimentary bit lines /BL1 and /BL2 each are fixed to the precharge voltage VPR without depending on the amount of voltage transition of the bit line BL1 caused by the amplification strength of the write amplifier WA, the potential difference between the adjacent bit line pair BL2 and /BL2, or the parasitic capacity Cb and the like. In this manner, a write noise during data writing into the bit line BL1 is shielded, a refresh operation in the adjacent bit line pair BL2 and /BL2 is normally carried out, and the memory data is not inverted.

The present invention is not limited to the foregoing embodiments, and, of course, various modification or alteration can occur without departing from the spirit of the present invention.

In a specific example of the second embodiment, there is shown that, at the initial write stage for the bit line BL1 prior to amplifying data to be written while the data bus DB and the complimentary data bus /DB are paired, only the data bus DB is first amplified, and the complementary data bus /DB is fixed to the precharge voltage VPR, thereby shielding a write noise. In this case, the complimentary bit lines /BL1 and /BL2 connected to the complimentary data bus /DB are fixed to the precharge voltage VPR by means of the bit line short circuits BS21 and BS22. Because of this, for example, at the initial write stage for the bit line BL1, it is possible to set the complimentary data bus /DB so as not to be driven.

In addition, in the illustrative view illustrating a principle of operation according to the first and second embodiments, the column address signals ADCn and an address signal A0 are input to bit line short signal circuits BSS1 and BSS2, and the bit line short signal BRS0n and BRS1n are output. In the illustrative view illustrating a principle of operation according to the third embodiment, the column address signals ADCn and an address signal A0 are input to the column switch signal circuits CS3n, and the column switch signals CL0n and CL1n are output. This illustrative view illustrates a case in which the adjacent bit lines are fixed to the precharge voltage VPR according to the bit line BLn or /BLn targeted for writing. However, a combination for fixing to the precharge voltage VPR can be changed as required. For example, it is possible to specify a region for fixing to the precharge voltage VPR by dividing the memory cells into sub-blocks.

In addition, although the precharge voltage VPR is utilized so as to shield a write noise, another voltage source can be utilized without being limited thereto as long as a stationary potential is provided.

The first to third embodiments have described that bit lines /BL1 and /BL2 are defined as complementary bit lines relevant to bit lines BL1 and BL2. This is because the memory cells Tc and Td connected to the bit lines BL1 and BL2 are selected by the word line WL. Therefore, of course, this applies to a case in which the memory cells Ta and Tb are selected, thereby reversing a relationship between a bit line and its complimentary bit line.

According to the present invention, there can be provided a semiconductor integrated circuit device in which, when a data write operation for a memory cell is carried out by fitting it in a period while in data reading from the memory cell for the adjacent bit lines, the complimentary bit line side in the adjacent bit line pair is clamped to a predetermined voltage, whereby an effect of a write noise in a readout operation for the adjacent bit lines is reduced, making it possible to ensure stable operation.

What is claimed is:

1. A semiconductor integrated circuit device comprising a plurality of memory cells, a plurality of word lines, and a plurality of bit line pairs, the circuit device comprising a voltage fixing section for, when data is written into a predetermined bit line or a predetermined complimentary bit line, fixing to a predetermined voltage a complimentary bit line arranged between adjacent bit lines operating data readout or a bit line arranged between adjacent complimentary bit lines operating data readout.

2. A semiconductor integrated circuit device as claimed in claim 1, wherein the voltage fixing section fixes to the predetermined voltage a plurality of complimentary bit lines containing a complimentary bit line paired with the predetermined bit line or a plurality of bit lines containing a bit line paired with the predetermined complimentary bit line.

3. A semiconductor integrated circuit device as claimed in claim 2, further comprising a plurality of clamp sections for independently fixing to the predetermined voltage the plurality of bit lines each and the plurality of complementary bit lines each during a period when the word line is not activated, wherein the voltage fixing section comprises: a selecting section for properly selecting the clamp section; and a timing setting section for setting a timing for fixing to the predetermined voltage the plurality of complimentary bit lines or the plurality of bit lines after the word line is activated.

4. A semiconductor integrated circuit device as claimed in claim 2, further comprising: a switch section for connecting a bit line with a data line for data transfer; and a complimentary switch section for connecting a complimentary bit line with a complimentary data line paired with the data line, wherein the voltage fixing section comprises:
- a switch selecting section making conductive the switch section or the complimentary switch section for the predetermined bit line or the predetermined complimentary bit line, and the complimentary switch section or the switch section for the plurality of complimentary bit line or the plurality of bit lines, and making nonconductive the switch section or the complimentary switch section for the bit line or the complimentary bit line having connected thereto a memory cell for which data writing is not carried out;
- a timing setting section for, after the word line has been activated as well, setting a timing for fixing to the predetermined voltage the plurality of complimentary bit lines or the plurality of bit lines; and
- a clamp section for fixing to the predetermined voltage the complimentary data line or the data line at a timing set by the timing setting section before data to be written is amplified when the data line and the complimentary data line are paired.

5. A semiconductor integrated circuit device as claimed in claim 3, further comprising:
- a switch section for connecting a bit line with a data line for data transfer;
- a complimentary switch section for connecting a complimentary bit line with a complimentary data line paired with the data line; and
- a switch selecting section for making conductive the switch section that corresponds to the predetermined bit line or the complimentary switch section that corresponds to the predetermined complimentary bit line, and making nonconductive the complimentary switch section that corresponds to the plurality of complimentary bit lines or the section switch that corresponds to the plurality of bit lines at the timing.

6. A semiconductor integrated circuit device as claimed in claim 1, further comprising: a first clamp section for fixing to a predetermined voltage a bit line during a period when the word line is not activated; and a second clamp section for fixing to a predetermined voltage a complimentary bit line during a period when the word line is not activated, wherein the voltage fixing section comprises: a selecting section for selecting the second clamp section or the first clamp section; and a timing setting section for setting a timing for fixing to the predetermined voltage the complimentary bit line or the bit line after the word line is activated.

7. A semiconductor integrated circuit device as claimed in claim 1, further comprising:
- a switch section for connecting a bit line with a data line for data transfer a complimentary switch section controlled in common with the switch section, the complimentary switch section connecting a complimentary bit line with a complimentary data line paired with the data line; and
- a timing setting section for, after the word line has been activated, setting a timing for fixing to the predetermined voltage the complimentary bit line paired with the predetermined bit line or a bit line paired with the predetermined complimentary bit line, wherein, when data is written, only the data line or the complimentary data line is amplified at a timing set by the timing setting section prior to amplifying data to be written when the data line and the complimentary data line are paired.

8. A semiconductor integrated circuit device as claimed in claim 7, further comprising a plurality of clamp sections for independently fixing to the predetermined voltage a plurality of bit lines containing a bit line paired with the predetermined complimentary bit line each and a plurality of complimentary bit lines containing a complimentary bit line paired with the predetermined bit line each during a period when the word line is not activated, wherein the voltage fixing section has a selecting section for selecting the plurality of clamp sections as required, and the complimentary data line or the data line are not driven at a timing set by the timing setting section before data to be written is amplified when the data line and the complimentary data line are paired.

9. A semiconductor integrated circuit device as claimed in claim 7, wherein the complimentary data line or the data line are driven with the predetermined voltage at a timing set by the timing setting section before data to be written is amplified when the data line and the complimentary data line are paired.

10. A semiconductor integrated circuit device as claimed in claim 1, further comprising: a switch section for connecting a bit line with a data line for data transfer; and a complimentary switch section for connecting a complimentary bit line with a complimentary data line paired with the data line, wherein the voltage fixing section comprises: a switch selecting section for, when data is written, making conductive the switch section or the complimentary switch section for the predetermined bit line or the predetermined complimentary bit line and the complimentary switch section or the switch section for the complimentary bit line or the bit line; a timing setting section for, after the word line has been activated as well, setting a timing for fixing to the predetermined voltage the complimentary bit line or the bit line; and a clamp section for fixing to the predetermined voltage the complimentary data line or the data line at a timing set by the timing setting section before data to be written is amplified when the data line and the complimentary data line are paired.

11. A semiconductor integrated circuit device as claimed in claim 1, wherein, after a potential difference between a voltage value written into the predetermined bit line or the predetermined complimentary bit line and a voltage value of a complimentary bit line paired with the predetermined bit line or a bit line paired with the complimentary bit line of has reached a amplification threshold value, fixing a complimentary bit line paired with the predetermined bit line or a bit line paired with the predetermined complimentary bit line to the predetermined voltage is released.

12. A semiconductor integrated circuit device as claimed in claim 11, further comprising a sense amplifier for amplifying a potential difference between the bit line and the complimentary bit line, wherein the amplification threshold value is equal to or greater than a voltage value of amplification sensitivity of the sense amplifier.

13. A semiconductor integrated circuit device as claimed in claim 1, wherein selection of the memory cell and reading out or writing the data from/to the memory cell are carried out by one command entry.

14. A semiconductor integrated circuit device as claimed in claim 13, wherein the memory cell comprises a capacity element, and stores the data according to whether charge storage in the capacity element is present or absent.

15. A data writing method in a semiconductor integrated circuit device comprising: memory cells selected by a word line being activated; bit lines provided corresponding to each of the memory cells, the bit lines being connected to the memory cells according to selection of the word line; and a complimentary bit lines paired with the bit lines, the complimentary bit lines being adopted to amplify data input to/output from the memory cells, wherein the writing method comprises a voltage fixing step of, when data is written into a predetermined bit line or a predetermined complimentary bit line, fixing to a predetermined voltage a plurality of complimentary bit lines containing a complimentary bit line arranged between adjacent bit lines operating data readout or a plurality of bit lines containing the a bit line arranged between adjacent complimentary bit lines operating data readout.

16. A data writing method in the semiconductor integrated circuit device as claimed in claim 15, the method comprising:

a selecting step of, from among a plurality of clamp sections for independently fixing to the predetermined voltage the plurality of bit lines each and the plurality of complimentary bit lines each, selecting the clamp section for fixing to the predetermined voltage the plurality of complimentary bit lines or the plurality of bit lines; and a timing setting step of setting a period when the selected clamp section is activated to a predetermined period from after activation of the word line.

17. A data writing method in the semiconductor integrated circuit device as claimed in claim 16, further comprising a switch selecting step of, during the predetermined period, making conductive a switch section that exists between the predetermined bit line and a data line for data forward or a complimentary switch section that exists between the predetermined complimentary bit line and a complimentary data line for data forward, and making nonconductive a complimentary switch section that exists between the plurality of bit lines and the complimentary data line or a switch section that exists between the plurality of bit lines and the data line.

18. A data writing method in the semiconductor integrated circuit device as claimed in claim 15, wherein, in the predetermined period before data to be written is amplified when a data line connected to the bit line is paired with a complimentary data line connected to the complimentary bit line, the complimentary data line or the data line is not driven or fixed to the predetermined voltage, only the data line or the complimentary data line is amplified.

19. A data writing method in the semiconductor integrated circuit device as claimed in claim 15, further comprising:

a switch selecting step of make conductive a switch section between the predetermined bit line and a data line for data transfer or a complimentary switch section between a the predetermined complimentary bit line and a complimentary data line for data transfer and a complimentary switch section between each of the plurality of complimentary bit lines and the complimentary data line or a switch section between each of the plurality of bit lines and the data line, and keep nonconductive the switch section between the bit line or the complimentary bit line for which data writing is not carried out and the data line or the complimentary data line; and a timing setting step of setting to the predetermined period prior to data to be written is amplified when the data line and the complimentary data line are paired from after activation of the word line, a period for activating the complimentary switch section or the switch section, for connecting the plurality of complimentary bit lines or the plurality of bit lines selected in accordance with the switch selecting step with the complimentary data line or the data line, wherein, in the predetermined period, the complimentary data line or the data line is fixed to the predetermined voltage.

20. A data writing method in the semiconductor integrated circuit device as claimed in claim 15, wherein, after a potential difference between a voltage value written into the predetermined bit line or a the predetermined complimentary bit line and a voltage value of a complimentary bit line paired with the predetermined bit line or a bit line paired with a the predetermined complimentary bit line has reached an amplification threshold value, fixing of the plurality of complimentary bit lines or the plurality of bit lines to the predetermined voltage is released.

* * * * *